(12) United States Patent
Park et al.

(10) Patent No.: US 12,349,541 B2
(45) Date of Patent: Jul. 1, 2025

(54) DISPLAY DEVICE

(71) Applicant: Samsung Display Co., LTD., Yongin-si (KR)

(72) Inventors: Ju Chan Park, Seoul (KR); Sun Ho Kim, Seongnam-si (KR); Sun Hee Lee, Hwaseong-si (KR); Yoo Min Ko, Suwon-si (KR); Chea Eun Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 551 days.

(21) Appl. No.: 17/525,963

(22) Filed: Nov. 15, 2021

(65) Prior Publication Data
US 2022/0285469 A1      Sep. 8, 2022

(30) Foreign Application Priority Data

Mar. 2, 2021  (KR) ................... 10-2021-0027281

(51) Int. Cl.
*H10K 59/121*      (2023.01)
*H10K 59/124*      (2023.01)
(Continued)

(52) U.S. Cl.
CPC ..... *H10K 59/1213* (2023.02); *H10K 59/1216* (2023.02); *H10K 59/124* (2023.02);
(Continued)

(58) Field of Classification Search
CPC ...... H10K 59/10; H10K 59/12; H10K 59/121; H10K 59/123; H10K 59/124;
(Continued)

(56) References Cited

U.S. PATENT DOCUMENTS 10,256,165 B2 *  4/2019  Chung ............... H01L 23/4824
10,868,096 B2   12/2020  Park et al.
(Continued)

FOREIGN PATENT DOCUMENTS

KR   10-2019-0047565    5/2019
KR   10-2019-0055868    5/2019
(Continued)

OTHER PUBLICATIONS

Korean Office Action for Korean Patent Application No. 10-2021-0027281, dated Jan. 7, 2025.

*Primary Examiner* — Eduardo A Rodela
(74) *Attorney, Agent, or Firm* — KILE PARK REED & HOUTTEMAN PLLC

(57) ABSTRACT

A display device includes: a substrate including a first display area and a second display area; a plurality of first pixel circuit units positioned on the first display area; a plurality of first light-emitting elements respectively connected to the plurality of first pixel circuit unit; a plurality of second pixel circuit units positioned on the second display area; a plurality of second light-emitting elements respectively connected to the plurality of second pixel circuit units; and a driving circuit unit connected to the plurality of first pixel circuit units and the plurality of second pixel circuit units and overlapping the plurality of second light-emitting elements, wherein a number of the plurality of first pixel circuit units per unit area is larger than a number of the plurality of second pixel circuit units per unit area.

20 Claims, 22 Drawing Sheets

(51) Int. Cl.
   *H10K 59/131*   (2023.01)
   *H10D 86/40*   (2025.01)
   *H10D 86/60*   (2025.01)
   *H10K 77/10*   (2023.01)
   *H10K 102/00*   (2023.01)

(52) U.S. Cl.
   CPC ......... *H10K 59/131* (2023.02); *H10D 86/441* (2025.01); *H10D 86/60* (2025.01); *H10K 77/111* (2023.02); *H10K 2102/311* (2023.02)

(58) Field of Classification Search
   CPC ...... H10K 59/131; H10K 59/87; H10K 77/10; H10K 77/111; H10K 59/1213; H10K 59/1216; H10K 2102/311; H01L 27/124
   See application file for complete search history.

(56) References Cited

U.S. PATENT DOCUMENTS

| | | | |
|---|---|---|---|
| 11,411,062 B2 | 8/2022 | Kim et al. | |
| 11,594,587 B2 * | 2/2023 | Son | H10K 59/8791 |
| 11,600,793 B2 * | 3/2023 | Han | C08G 73/1039 |
| 11,653,546 B2 * | 5/2023 | Lee | H10K 50/844 |
| | | | 345/173 |
| 11,785,799 B2 * | 10/2023 | Kang | H10K 77/111 |
| | | | 257/40 |
| 11,797,048 B2 * | 10/2023 | Cho | G06F 1/1652 |
| 11,825,702 B2 * | 11/2023 | Song | H10K 71/00 |
| 2018/0033831 A1 * | 2/2018 | An | G06F 3/0446 |
| 2018/0166652 A1 * | 6/2018 | Kim | B32B 27/28 |
| 2019/0148476 A1 * | 5/2019 | Park | H10K 59/131 |
| | | | 257/40 |
| 2020/0243781 A1 * | 7/2020 | Kim | H10K 50/844 |
| 2021/0020716 A1 | 1/2021 | Kim et al. | |
| 2022/0093705 A1 | 3/2022 | Kim et al. | |
| 2022/0359641 A1 | 11/2022 | Kim et al. | |

FOREIGN PATENT DOCUMENTS

| | | |
|---|---|---|
| KR | 10-2019-0104091 | 9/2019 |
| KR | 10-2020-0085962 | 7/2020 |
| KR | 10-2020-0087384 | 7/2020 |
| KR | 10-2021-0010716 | 1/2021 |

* cited by examiner

DISPLAY DEVICE

CROSS-REFERENCE TO RELATED APPLICATION

This application claims priority from and the benefit of Korean Patent Application No. 10-2021-0027281, filed on Mar. 2, 2021, which is hereby incorporated by reference for all purposes as if fully set forth herein.

BACKGROUND

Field

Embodiments of the invention relate generally to a display device.

Discussion of the Background

A display device is a device that displays images and includes a liquid crystal display (LCD), an organic light emitting diode (OLED), and the like. The display device is used in various electronic devices such as a mobile phone, a navigation device, a digital camera, an electronic book, a portable game machine, and various types of terminals.

The display device may include a display area in which an image is displayed and a peripheral area in which the image is not displayed. A plurality of pixels may be disposed in the display area in a row direction and a column direction. Within each pixel, various elements such as transistors, capacitors, etc. and various wires that may supply signals to these elements may be positioned. Various wires, scan drivers, data drivers, controllers, etc. that transmit electrical signals to drive these pixels may be positioned in the peripheral area.

Although the demand to reduce the size of the peripheral area and enlarge the display area is increasing, there is a problem that it is difficult to reduce the size of the peripheral area because the area occupied by the driving unit is increasing in the process of implementing high resolution and high speed driving.

The above information disclosed in this Background section is only for understanding of the background of the inventive concepts, and, therefore, it may contain information that does not constitute prior art.

SUMMARY

Devices constructed according to embodiments of the invention are capable of expanding an image display region of a display device by reducing a dead space within the image display region and by reducing a size of a bezel of the display device.

Embodiments may provide a display device in which a display area is extended.

Additional features of the inventive concepts will be set forth in the description that follows, and in part will be apparent from the description, or may be learned by practice of the inventive concepts.

A display device according to an embodiment includes: a substrate including a first display area and a second display area; a plurality of first pixel circuit units positioned on the first display area; a plurality of first light-emitting elements respectively connected to the plurality of first pixel circuit unit; a plurality of second pixel circuit units positioned on the second display area; a plurality of second light-emitting elements respectively connected to the plurality of second pixel circuit units; and a driving circuit unit connected to the plurality of first pixel circuit units and the plurality of second pixel circuit units and overlapping the plurality of second light-emitting elements, wherein a number of the plurality of first pixel circuit units per unit area is larger than a number of the plurality of second pixel circuit units per unit area.

The display device according to an embodiment may further include: a first interlayer insulating layer positioned on the substrate and including an opening; and a second interlayer insulating layer positioned within the opening, and the opening may be positioned in the second display area.

The first interlayer insulating layer may include an inorganic insulating material, and the second interlayer insulating layer may include an organic insulating material.

The opening and the second interlayer insulating layer may not be positioned in the first display area.

The display device may include a plurality of pixel circuit regions, a plurality of second pixel circuit units may be respectively positioned in a plurality of pixel circuit regions, and a plurality of pixel circuit regions may be separated from each other by the opening and the second interlayer insulating layer in the second display area.

The opening may be formed to surround the edge of a plurality of pixel circuit regions, so that a plurality of pixel circuit regions may be distinguished by the opening.

The opening may have a lattice shape in a plan view.

The second interlayer insulating layer may have a lattice shape in a plan view.

The second pixel circuit unit may include: a semiconductor positioned in the substrate; a first gate insulating layer positioned on the semiconductor; a gate electrode positioned on the first gate insulating layer; a second gate insulating layer positioned on the gate electrode; and a first storage electrode positioned on the second gate insulating layer, and the first interlayer insulating layer may be positioned on the first storage electrode, and the first storage electrodes of a plurality of second pixel circuit units may be separated from each other by the opening and the second interlayer insulating layer.

The display device according to an embodiment may further include a bridge electrode positioned on the first interlayer insulating layer and the second interlayer insulating layer and connecting two first storage electrodes adjacent to each other among the first storage electrodes of the plurality of second pixel circuit units separated each other.

The opening may be further formed in the first gate insulating layer and the second gate insulating layer.

The display device according to an embodiment may further include: a plurality of lower scan lines connected to the plurality of second pixel circuit units and respectively positioned within the plurality of pixel circuit regions; and an upper scan line connected to a plurality of lower scan lines, and the plurality of lower scan lines may be separated by the opening.

The upper scan line may overlap the opening.

The substrate may further include a bending region overlapping the second display area, and the second pixel circuit unit may be positioned within the bending region.

Each light emission region of the plurality of first light-emitting elements may overlap the first pixel circuit unit connected thereto, and the light emission region of at least any one of the plurality of second light-emitting elements may not overlap the second pixel circuit unit connected thereto and may overlap the second pixel circuit unit that is not connected thereto.

A display device according to an embodiment includes: a substrate including a first display area and a second display area; a first pixel circuit unit positioned on the first display area; a second pixel circuit unit positioned on the second display area; a first interlayer insulating layer positioned between a plurality of conductive layers configuring the first pixel circuit unit and the second pixel circuit unit and including an opening; a second interlayer insulating layer positioned within the opening; a first light-emitting element connected to the first pixel circuit unit; a second light-emitting element connected to the second pixel circuit unit; and a driving circuit unit connected to the first pixel circuit unit and the second pixel circuit unit and overlapping the second light-emitting element, wherein the opening is positioned in the second display area.

The first interlayer insulating layer may include an inorganic insulating material, the second interlayer insulating layer may include an organic insulating material, and the opening and the second interlayer insulating layer may not be positioned in the first display area.

The display device may include a plurality of pixel circuit regions, the plurality of second pixel circuit units may be positioned within each of the plurality of pixel circuit regions, and the plurality of pixel circuit regions may be separated from each other by the opening and the second interlayer insulating layer in the second display area.

The substrate may further include a bending region overlapping the second display area, and the second pixel circuit unit may be positioned within the bending region.

A display device according to an embodiment includes: a substrate including a first display area and a second display area; a first pixel circuit unit positioned on the first display area; a second pixel circuit unit positioned on the second display area; a first interlayer insulating layer positioned between a plurality of conductive layers configuring the first pixel circuit unit and the second pixel circuit unit and including an opening; a second interlayer insulating layer positioned within the opening; a first light-emitting element connected to the first pixel circuit unit; and a second light-emitting element connected to the second pixel circuit unit, wherein the substrate further includes a bending region overlapping the second display area, and the second pixel circuit unit and the opening are positioned in the bending region.

According to embodiments, the display device with an extended display area may be provided.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
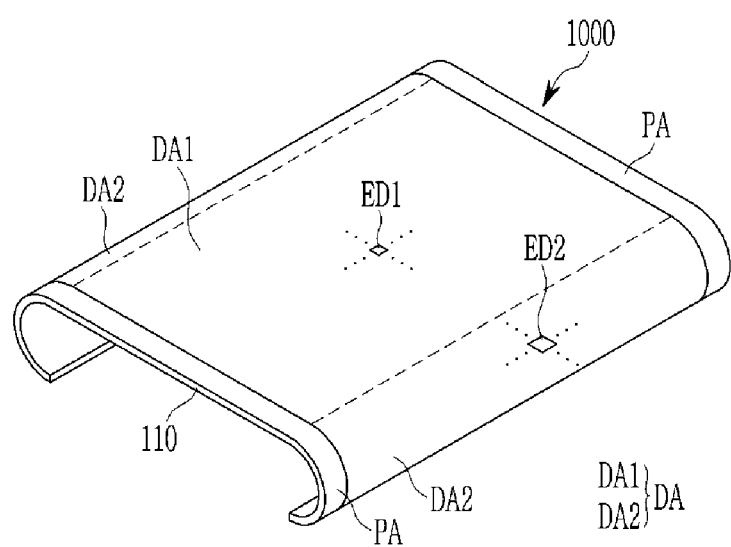
FIG. 1 is a perspective view showing a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Further, as used herein, the term "in a plan view" signifies when an object portion is viewed from above, and the term "in a cross-sectional view" signifies when a cross-section taken by vertically cutting an object portion is viewed from the side.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

First, a display device according to an embodiment is described with reference to FIG. 1, FIG. 2, and FIG. 3.

Figure 2:
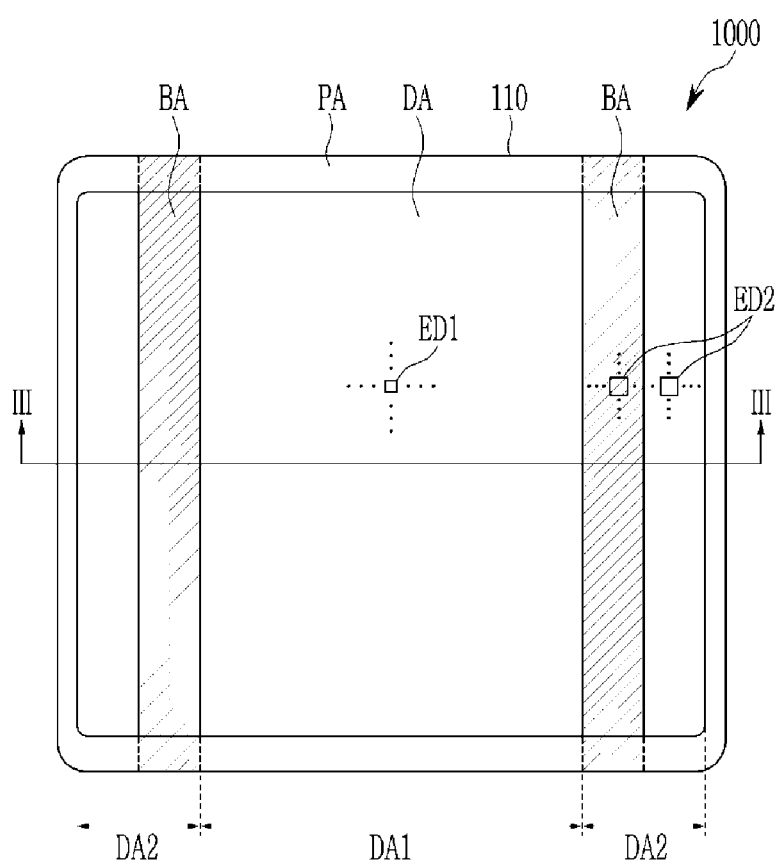
FIG. 2 is an unfolded top plan view showing a bent part of a display device according to an embodiment.
Figure 3:
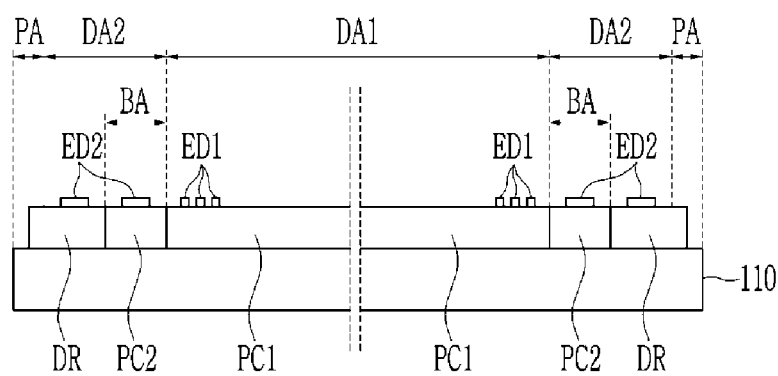
FIG. 3 is a cross-sectional view taken along a line III-III of FIG. 2.

FIG. 1 is a perspective view showing a display device according to an embodiment that is constructed according to principles of the invention, FIG. 2 is an unfolded top plan view showing a bent part of a display device according to an embodiment, and FIG. 3 is a cross-sectional view taken along a line III-III of FIG. 2.

As shown in FIG. 1 to FIG. 3, a display device 1000 according to an embodiment includes a substrate 110 and light-emitting elements ED1 and ED2 positioned on the substrate 110.

The substrate 110 includes a display area DA and a peripheral area PA adjacent to the display area DA.

The display area DA may be positioned in the center of the display device 1000 and may have a substantially rectangular shape, and each corner may have a rounded shape. However, the shape of the display area DA and the shape of the corners are not limited thereto and may be variously changed. The display area DA may include a first display area DA1 and a second display area DA2 adjacent to the first display area DA1. The first display area DA1 may be positioned in the center of the display area DA, and the second display area DA2 may be positioned on both sides of the first display area DA1, for example, the left side and the right side. However, this is only one example, and the positions of the first display area DA1 and the second display area DA2 may be variously changed. For example, the first display area DA1 may be formed in an approximately quadrangle shape, and the second display area DA2 may be positioned so as to surround four corners of the first display area DA1.

The peripheral area PA may be formed of a shape surrounding the display area DA. The peripheral area PA is a region in which an image is not displayed, and may be positioned on the outer side of the display device.

At least some of the display device 1000 according to an embodiment may have a curved shape. For example, the center portion of the display device 1000 may be flat, and the edge portion may have a curved shape. Accordingly, the substrate 110 may include a bending area BA. The bending area BA may be positioned on at least part of the second display area DA2. That is, at least a portion of the second display area DA2 of the substrate 110 may have a curved shape. The bending area BA may be positioned on a portion of the second display area DA2 adjacent to the first display area DA1, and may also be positioned on the peripheral area PA adjacent to the second display area DA2.

The light-emitting elements ED1 and ED2 may emit predetermined light. For example, the light-emitting elements ED1 and ED2 may emit light of red, green, and blue, or white. The display device 1000 may display a predetermined image through light emitted from the light-emitting elements ED1 and ED2. The light-emitting elements ED1 and ED2 may include a first light-emitting element ED1 and a second light-emitting element ED2. The light-emitting elements ED1 and ED2 may be positioned in the display area DA. The first light-emitting element ED1 may be positioned in the first display area DA1, and the second light-emitting element ED2 may be positioned in the second display area DA2. The display device 1000 according to an embodiment may include a plurality of first light-emitting elements ED1 and a plurality of second light-emitting elements ED2. A plurality of first light-emitting elements ED1 may be disposed along the row direction and the column direction in the first display area DA1, and a plurality of second light-emitting element ED2 may be disposed along the row direction and the column direction in the second display area DA2. Some of the plurality of second light-emitting elements ED2 may overlap the bending area BA, and some may not overlap the bending area BA. The size of the first light-emitting element ED1 and the size of the second light-emitting element ED2 may be the same or different. For example, the size of the second light-emitting element ED2 may be larger than the size of the first light-emitting element ED1. The number of the first light-emitting elements ED1 per unit area and the number of the second light-emitting elements ED2 per unit area may be the same or different. For example, the number of the second light-emitting elements ED2 per unit area may be less than the number of the first light-emitting elements ED1 per unit area. The resolution of the first display area DA1 and the resolution of the second display area DA2 may be the same or different. For example, the resolution of the first display area DA1 may be higher than that of the second display area DA2. The arrangement shape and the size of the first light-emitting element ED1 and the second light-emitting element ED2, the resolution of the first display area DA1 and the second display area DA2 are not limited thereto and may be variously changed.

The display device 1000 according to an embodiment may further include pixel circuit units PC1 and PC2 positioned on the substrate 110. The pixel circuit units PC1 and PC2 may include a first pixel circuit unit PC1 and a second pixel circuit unit PC2. The display device 1000 according to an embodiment may include a plurality of first pixel circuit units PC1 and a plurality of second pixel circuit units PC2. The first pixel circuit unit PC1 represents a region where a plurality of first pixel circuit units PC1 are substantially disposed along the row direction and the column direction, and the second pixel circuit unit PC2 represents a region where a plurality of second pixel circuit units PC2 are substantially disposed along the row direction and the column direction. The arrangement shape of a plurality of pixel circuit units PC1 and PC2 is not particularly limited and may be arranged in various forms. The first pixel circuit unit PC1 may be positioned in the first display area DA1, and the second pixel circuit unit PC2 may be positioned in the second display area DA2. Each pixel circuit unit PC1 and PC2 may be connected to one light-emitting element ED1 and ED2. The first pixel circuit unit PC1 may be connected to the first light-emitting element ED1, and the second pixel circuit unit PC2 may be connected to the second light-emitting element ED2. The size of one first pixel circuit unit PC1 and the size of one second pixel circuit unit PC2 may be the same or different. For example, the size of one second pixel circuit unit PC2 may be larger than the size of one first pixel circuit unit PC1. In addition, the structure of the first pixel circuit unit PC1 and the structure of the second pixel circuit unit PC2 may be different. The structure of the first pixel circuit unit PC1 and the structure of the second pixel circuit unit PC2 are described later.

The second pixel circuit unit PC2 may overlap the bending area BA. In FIG. 3, it is shown that the region where the second pixel circuit unit PC2 is positioned matches the bending area BA, but is not limited thereto. At least part of the second pixel circuit unit PC2 may overlap the bending area BA, and the other part may not overlap the bending area BA. In addition, the entire second pixel circuit unit PC2 may overlap the bending area BA.

The display device 1000 according to an embodiment may further include a driving circuit unit DR positioned on the substrate 110. The driving circuit unit DR may include a plurality of driving units and signal wires. For example, the driving circuit unit DR may include a scan driver, a data driver, a driving voltage supply line, a common voltage supply line, and signal transmitting wires connected to them. The scan driver generates a scan signal and transmits it to the pixel circuit units PC1 and PC2 through the scan line. The data driver generates a data signal and transmits it to the pixel circuit units PC1 and PC2 through the data line. The driving voltage supply line transmits the driving voltage to the pixel circuit units PC1 and PC2. The common voltage supply line transmits the common voltage to one electrode of the light-emitting elements ED1 and ED2. At least part of the driving circuit unit DR may be positioned in the second display area DA2, and the remaining part may be positioned in the peripheral area PA.

The driving circuit unit DR may not overlap the bending area BA. However, the present invention is not limited thereto, and at least a portion of the driving circuit unit DR may overlap the bending area BA.

In the first display area DA1, the first pixel circuit unit PC1 may be electrically connected to the first light-emitting element ED1 disposed on the first pixel circuit unit PC1. At this time, the light emission region of the first light-emitting element ED1 may overlap the first pixel circuit unit PC1 connected thereto. The first display area DA1 is a region from which light is emitted by the first light-emitting element ED1.

In the second display area DA2, the second pixel circuit unit PC2 may be electrically connected to the second light-emitting element ED2 and separated by a predetermined interval. At this time, the light emission region of the second light-emitting element ED2 may not overlap the second pixel circuit unit PC2 connected thereto. The light emission region of the second light-emitting element ED2 may overlap the second pixel circuit unit PC2 that is not connected thereto. The light emission region of the second light-emitting element ED2 may overlap the driving circuit unit DR. The light emission region of some second light-emitting element ED2 may overlap the second pixel circuit unit PC2 connected thereto. The second display area DA2 is a region in which light is emitted by the second light-emitting element ED2.

In a general display device, the pixel circuit unit and the light-emitting element are positioned in the display area, and the driving circuit unit is positioned and the pixel circuit unit and the light-emitting element are not positioned in the peripheral area surrounding the display area. Accordingly, light is not emitted in the peripheral area where the driving circuit unit is positioned and a dead space is formed. In the display device 1000 according to an embodiment, the second light-emitting element ED2 is positioned at the portion where the driving circuit unit DR is positioned to emit light, so that a region in which the screen is displayed may be expanded. That is, by positioning the second light-emitting element ED2 on the driving circuit unit DR, the dead space may be reduced and the bezel may be reduced.

Next, one pixel of the display device according to an embodiment is described with reference to FIG. 4.

Figure 4:
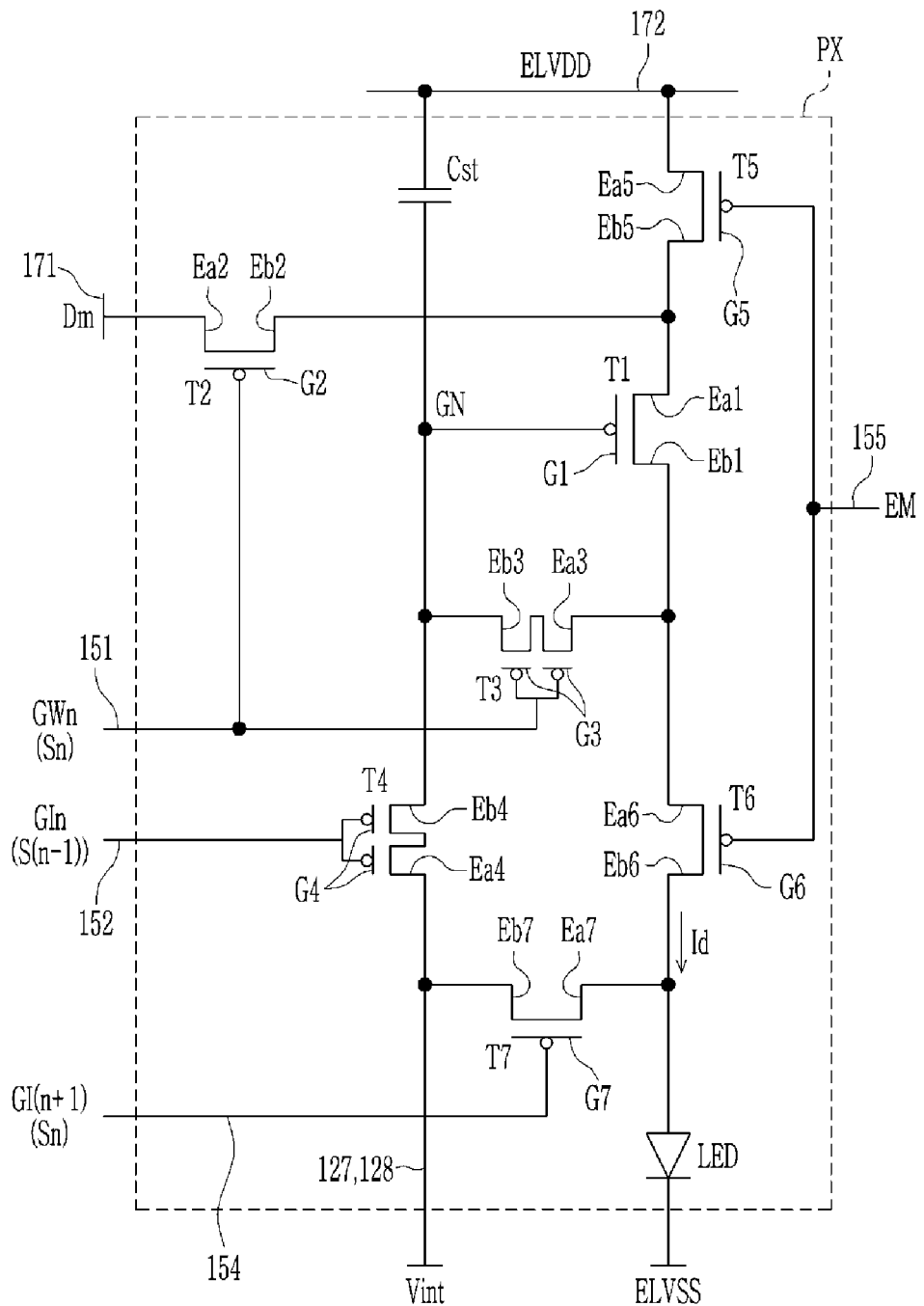
FIG. 4 is a circuit diagram of one pixel of a display device according to an embodiment.

FIG. 4 is a circuit diagram of one pixel according to a display device according to an embodiment.

As shown in FIG. 4, the display device according to an embodiment includes a plurality of pixels PX and a plurality of signal lines 127, 151, 152, 153, 154, 171, and 172 capable of displaying an image. One pixel PX may include a plurality of transistors T1, T2, T3, T4, T5, T6, and T7, a capacitor Cst, and at least one light emitting diode, which are connected to a plurality of signal lines 127, 151, 152, 153, 154, 171, and 172. In the present embodiment, an example in which one pixel PX includes one light emitting diode (LED) is mainly described.

The signal lines 127, 151, 152, 154, 155, 171, and 172 may include an initialization voltage line 127, a plurality of scan lines 151, 152, and 154, a light emission control line 155, a data line 171, and a driving voltage line 172.

The initialization voltage line 127 may transmit the initialization voltage Vint. A plurality of scan lines 151, 152, and 154 may transmit scan signals GWn, Gin, and GI(n+1). The scan signals GWn, Gin, and GI(n+1) may transmit a gate-on voltage and a gate-off voltage capable of turning-on/turning-off the transistors T2, T3, T4, and T7 included in the pixel PX.

The scan lines 151, 152, and 154 connected to one pixel PX may include a first scan line 151 capable of transmitting the scan signal GWn, a second scan line 152 capable of transmitting the scan signal GI, having the gate-on voltage at the different timing from that of the first scan line 151, and third scan line 154 capable of transmitting the scan signal GI(n+1). In the present embodiment, an example in which the second scan line 152 transmits the gate-on voltage at timing prior to that of the first scan line 151 is mainly described. For example, if the scan signal GWn is an n-th scan signal (Sn) (n is a natural number of 1 or more) among the scan signals applied during one frame, the scan signal GIn may be a scan signal of a previous stage such as the (n−1)+th scan signal S(n−1), and the scan signal GI(n+1) may be the n-th scan signal (Sn). However, the present embodiment is not limited thereto, and the scan signal GI(n+1) may be a different scan signal from the n-th scan signal (Sn).

The light emission control line 155 may transmit a control signal, and particularly may transmit a light emission control signal EM capable of controlling emission of the light emitting diode (LED) included in the pixel PX. The control signal transmitted by the light emission control line 155 may be the gate-on voltage and the gate-off voltage, and may have a different waveform from the scan signal transmitted by the scan lines 151, 152, and 154.

The data line 171 may transmit a data signal Dm, and the driving voltage line 172 may transmit a driving voltage ELVDD. The data signal Dm may have a different voltage level according to the image signal input to the display device, and the driving voltage ELVDD may have a substantially constant level.

The display device may further include a driving unit that transmits signals to a plurality of signal lines 127, 151, 152, 153, 154, 171, and 172.

A plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit scan signal GWn to the second transistor T2 and the third transistor T3, the second scan line 152 may transmit the scan signal Gin to the fourth transistor T4, the third scan line 154 may transmit the scan signal GI(n+1) to the seventh transistor T7, and the light emission control line 155 may transmit the light emission control signal EM to the fifth transistor T5 and the sixth transistor T6.

The gate electrode G1 of the first transistor T1 is connected to one terminal of the capacitor Cst through a driving gate node GN, the first electrode Ea1 of the first transistor T1 is connected to the driving voltage line 172 via the fifth transistor T5, and the second electrode Eb1 of the first transistor T1 is connected to an anode of the light emitting diode (LED) via the sixth transistor T6. The first transistor T1 may receive the data signal Dm transmitted by the data line 171 depending on the switching operation of the second transistor T2 to supply the driving current Id to the light emitting diode (LED).

The gate electrode G2 of the second transistor T2 is connected to the first scan line 151, the first electrode Ea2 of the second transistor T2 is connected to the data line 171, and the second electrode Eb2 of the second transistor T2 is connected to the first electrode Ea1 of the first transistor T1 and is connected to the driving voltage line 172 via the fifth transistor T5. The second transistor T2 is turned on depending on the scan signal GWn transmitted through the first scan line 151, thereby transmitting the data signal Dm transmitted from the data line 171 to the first electrode Ea1 of the first transistor T1.

The gate electrode G3 of the third transistor T3 is connected to the first scan line 151, and the first electrode Ea3 of the third transistor T3 is connected to the second electrode Eb1 of the first transistor T1 and is connected to the anode of the light emitting diode (LED) via the sixth transistor T6. The second electrode Eb3 of the third transistor T3 is connected to the second electrode Eb4 of the fourth transistor T4, one terminal of the capacitor Cst, and the gate electrode G1 of the first transistor T1. The third transistor T3 is turned on depending on the scan signal GWn transmitted through the first scan line 151 to connect the gate electrode G1 and the second electrode Eb1 of the first transistor T1, thereby diode-connecting the first transistor T1.

The gate electrode G4 of the fourth transistor T4 is connected to the second scan line 152, the first electrode Ea4 of the fourth transistor T4 is connected to the initialization voltage Vint terminal, and the second electrode Eb4 of the fourth transistor T4 is connected to one terminal of the capacitor Cst and the gate electrode G1 of the first transistor T1 through the second electrode Eb3 of the third transistor T3. The fourth transistor T4 is turned on depending on the scan signal Gin transmitted through the second scan line 152 to transmit the initialization voltage Vint to the gate electrode G1 of the first transistor T1, thereby performing initialization step of initializing the voltage of the gate electrode G1 of the first transistor T1.

The gate electrode G5 of the fifth transistor T5 is connected to the light emission control line 155, the first electrode Ea5 of the fifth transistor T5 is connected to the driving voltage line 172, and the second electrode Eb5 of the fifth transistor T5 is connected to the first electrode Ea1 of the first transistor T1 and the second electrode Eb2 of the second transistor T2.

The gate electrode G6 of the sixth transistor T6 is connected to the light emission control line 155, the first electrode Ea6 of the sixth transistor T6 is connected to the second electrode Eb1 of the first transistor T1 and the first electrode Ea3 of the third transistor T3, and the second electrode Eb6 of the sixth transistor T6 is electrically connected to the anode of the light emitting diode (LED). The fifth transistor T5 and the sixth transistor T6 are simultaneously turned on depending on the light emission control signal EM transmitted through the light emission control line 155, thereby transmitting the driving voltage ELVDD to the light emitting diode (LED) through the diode-connected first transistor T1.

The gate electrode G7 of the seventh transistor T7 is connected to the third scan line 154, the first electrode Ea7 of the seventh transistor T7 is connected to the second electrode Eb6 of the sixth transistor T6 and the anode of the light emitting diode (LED), and the second electrode Eb7 of the seventh transistor T7 is connected to the initialization voltage Vint terminal and the first electrode Ea4 of the fourth transistor T4.

The transistors T1, T2, T3, T4, T5, T6, and T7 may each be a P-type channel transistor such as a PMOS, however it is not limited thereto, and at least one among the transistors T1, T2, T3, T4, T5, T6, and T7 may be an N-type channel transistor and may include both of the P-type channel transistor and the N-type channel transistor.

As above-described, one terminal of the capacitor Cst is connected to the gate electrode G1 of the first transistor T1 and the other terminal thereof is connected to the driving voltage line 172. The cathode of the light emitting diode (LED) is connected to the common voltage ELVSS terminal transmitting the common voltage ELVSS, thereby receiving the common voltage ELVSS.

The pixel PX positioned in the first display area DA1 and the pixel PX positioned in the second display area DA2 may both have the circuit diagram structure of the pixel shown in FIG. 4 as above-described. However, it is not limited thereto, and the circuit diagram of the pixel PX positioned in the first display area DA1 and the circuit diagram of the pixel PX positioned in the second display area DA2 may be different. The circuit diagram of the pixel shown in FIG. 4 is only one example, and the number of the transistors, the number of the capacitors included in one pixel PX of the display device according to an embodiment, and the connection relationship thereof may be variously changed.

As above-described, the structure of the first pixel circuit unit PC1 and the structure of the second pixel circuit unit PC2 may be different. That is, even if the first pixel circuit unit PC1 and the second pixel circuit unit PC2 have the same circuit structure, the positions of the conductive layers of the transistor and the capacitor configuring them and the shapes of the insulating layers, etc. may be different. Next, a difference of the structures of the pixel positioned in the first display area DA1 and the pixel positioned in the second display area DA2 of the display device according to an embodiment is described with reference to FIG. 5 to FIG. 21.

Figure 5:
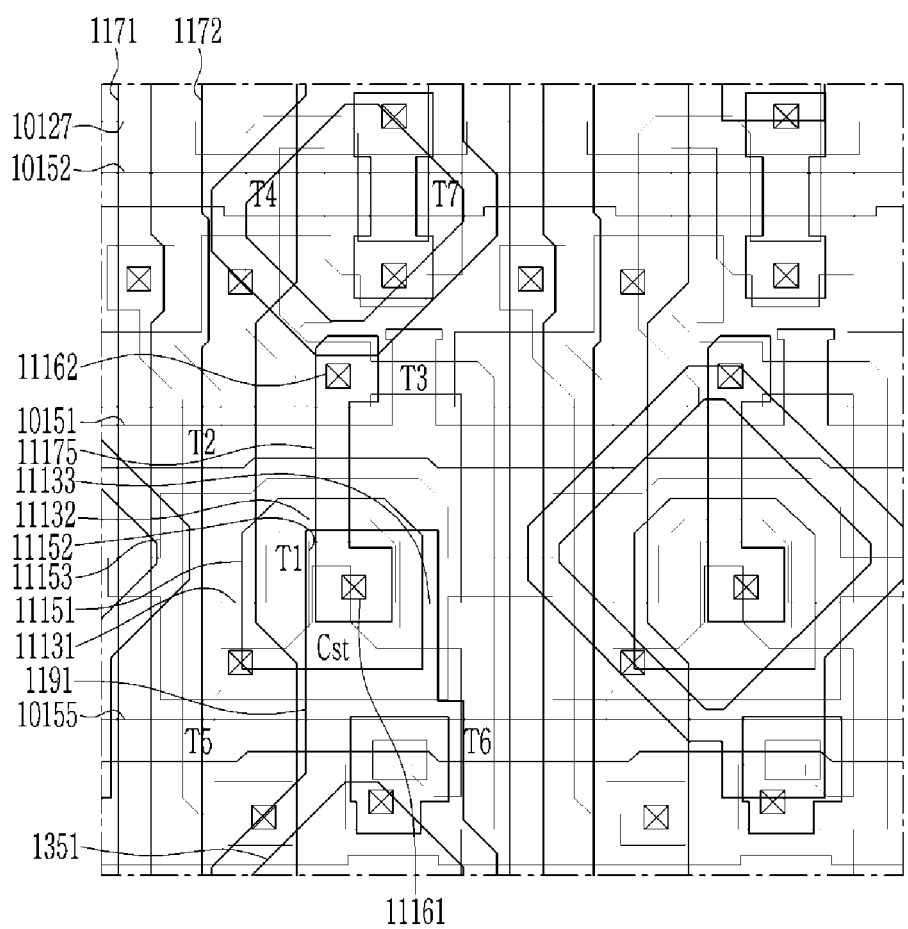
FIG. 5 is a top plan view showing a part of a first display area of a display device according to an embodiment.
Figure 6:
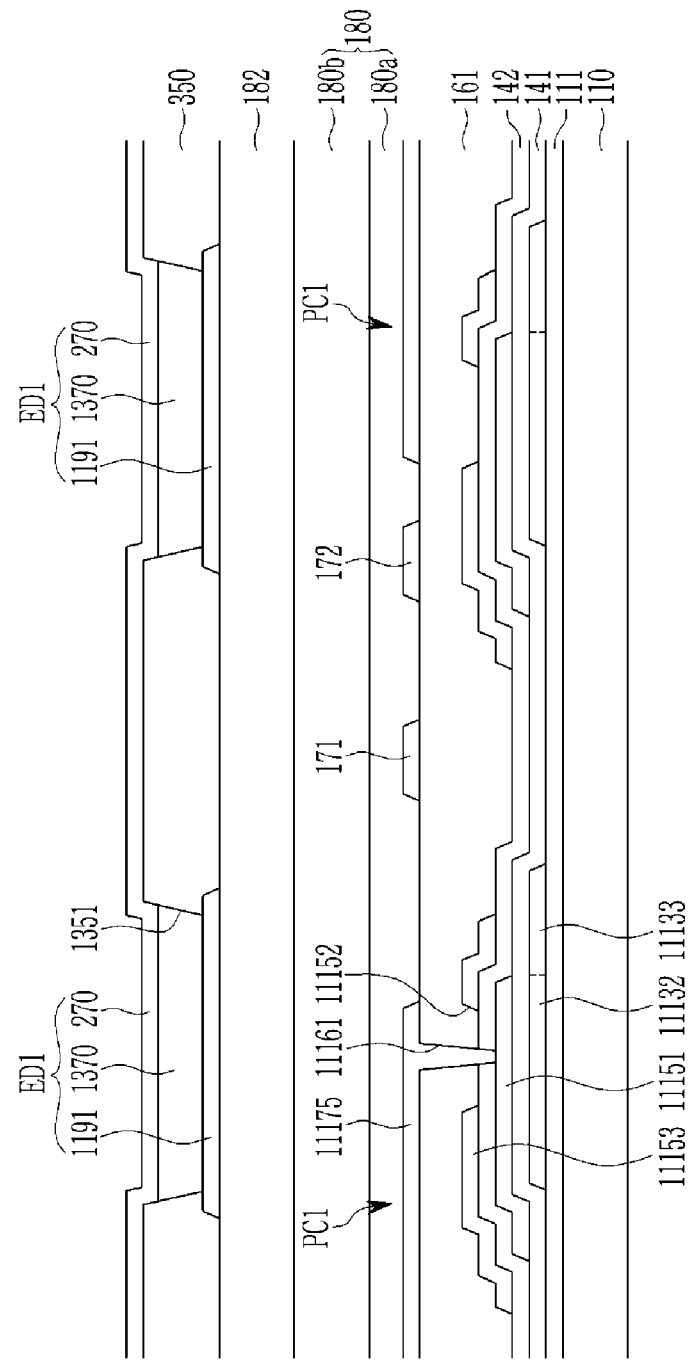
FIG. 6 is a cross-sectional view taken along a line VI-VI of FIG. 5.
Figure 10:
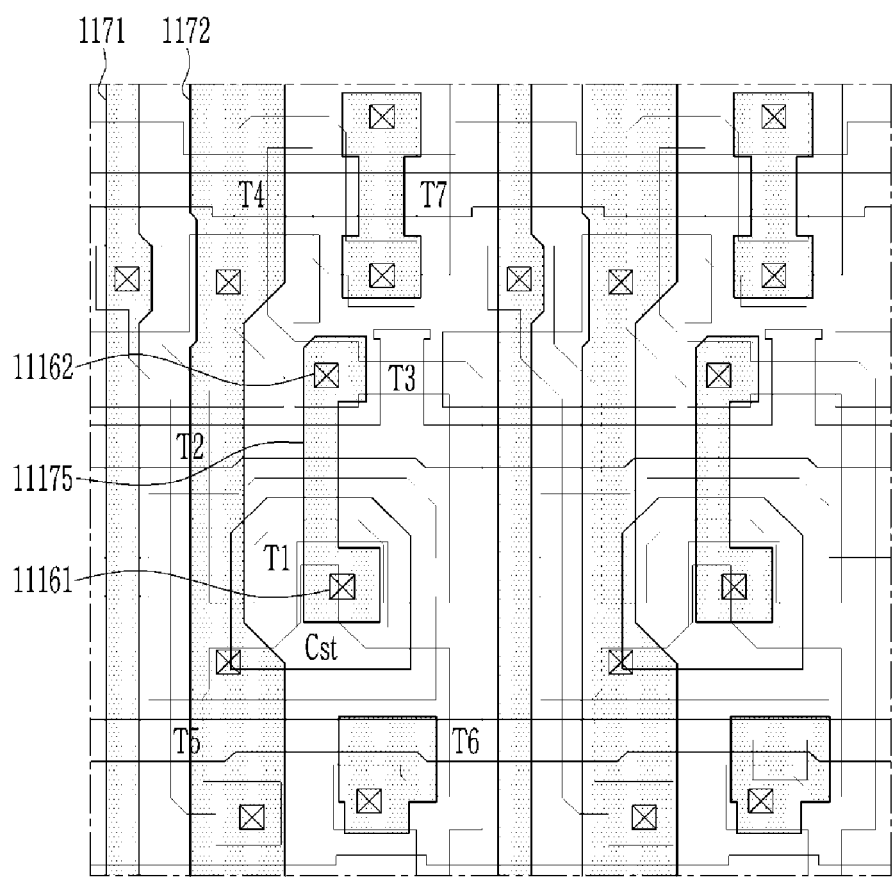
Figure 11:
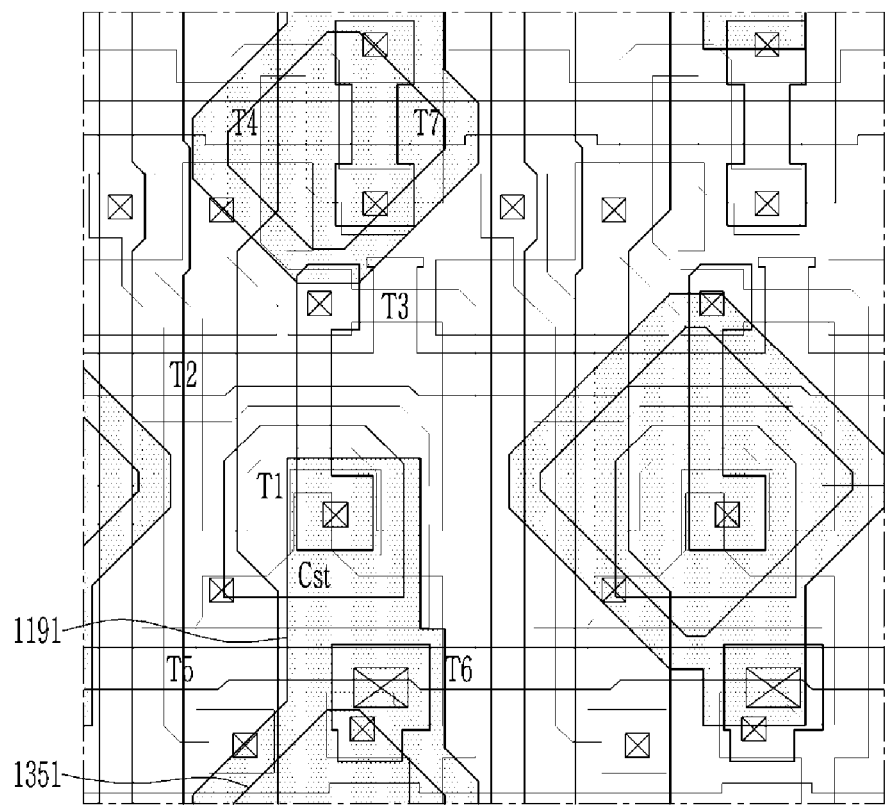
Figure 12:
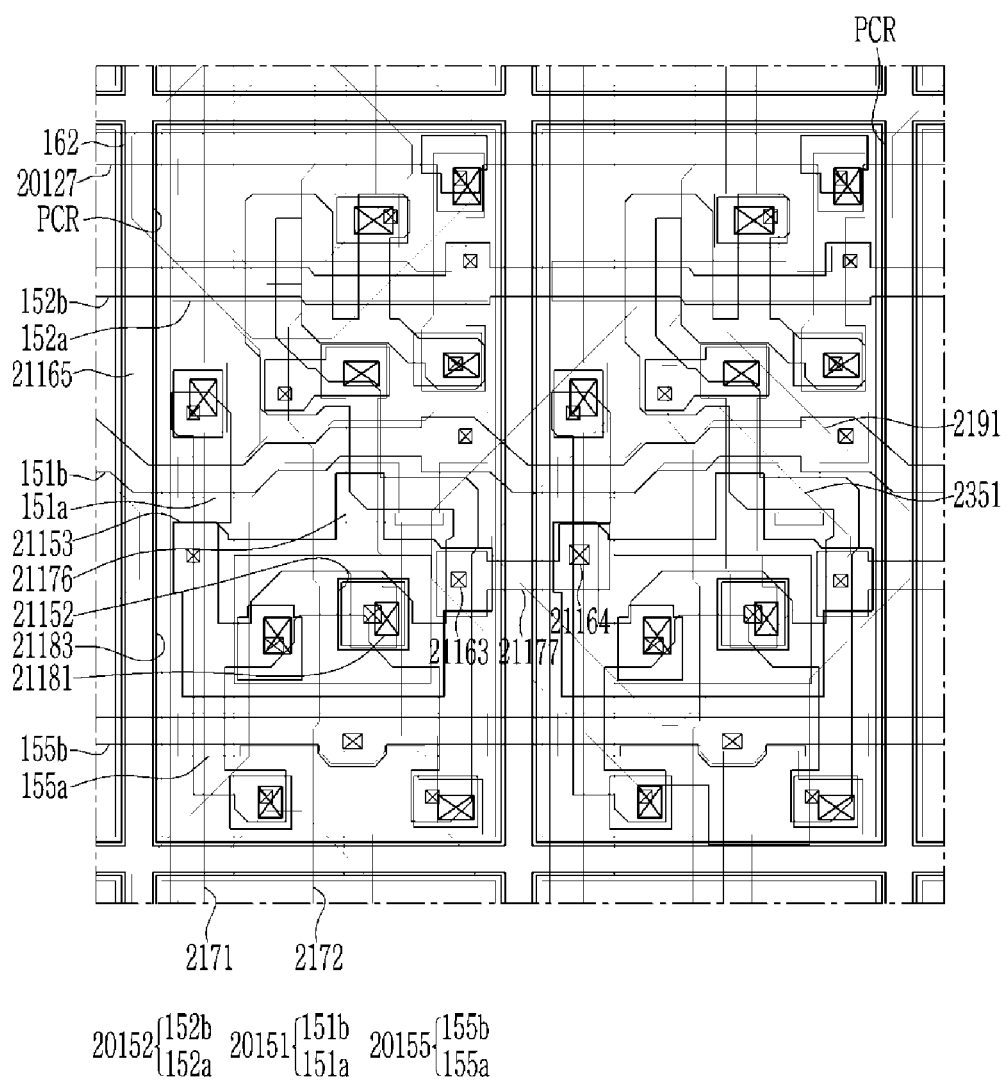
FIG. 12 is a top plan view showing a part of a second display area of a display device according to an embodiment.
Figure 13:
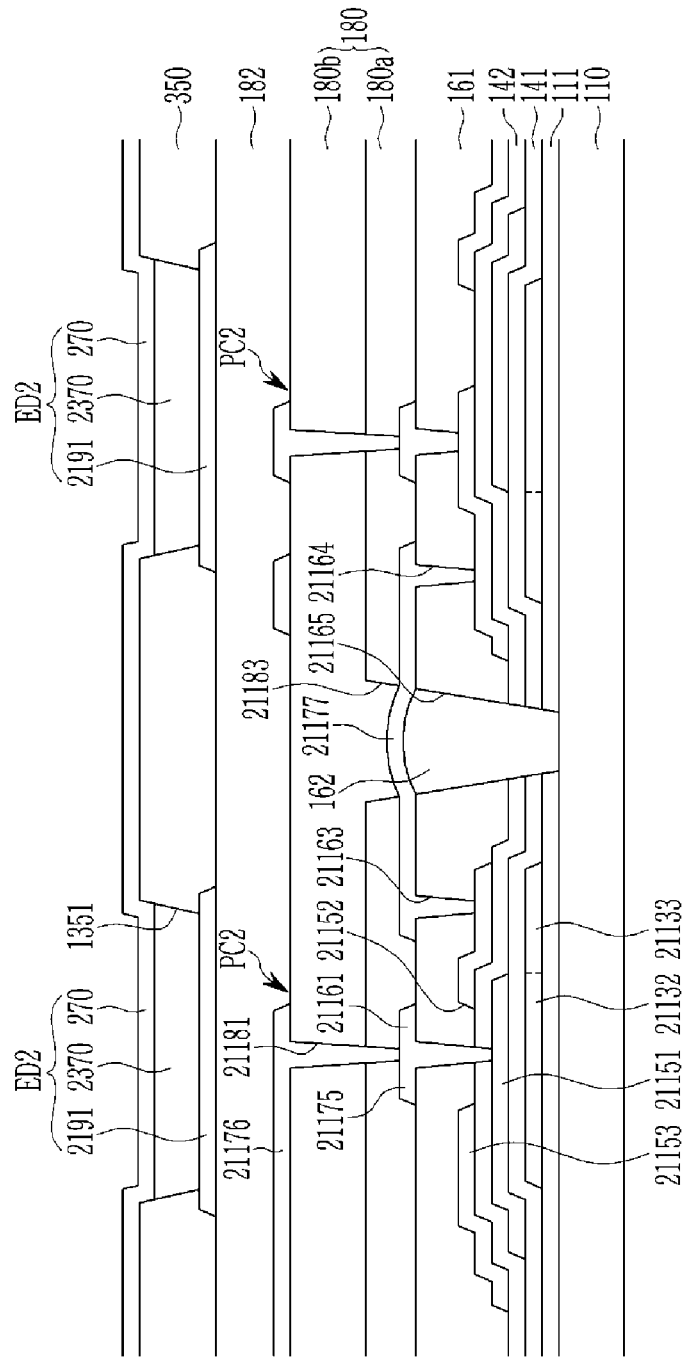
FIG. 13 is a cross-sectional view taken along a line XIII-XIII of FIG. 12.

FIG. 5 is a top plan view showing a part of a first display area of a display device according to an embodiment, and FIG. 6 is a cross-sectional view taken along a line VI-VI of FIG. 5. FIG. 7 to FIG. 11 are top plan views sequentially showing a part of a first display area of a display device according to an embodiment according to a manufacturing sequence. FIG. 12 is a top plan view showing a part of a second display area of a display device according to an embodiment, and FIG. 13 is a cross-sectional view taken along a line XIII-XIII of FIG. 12. FIG. 14 to FIG. 21 are top plan views sequentially showing a part of a second display area of a display device according to an embodiment according to a manufacturing sequence. FIG. 5 to FIG. 21 show two adjacent pixels with substantially the same structure. However, it is not limited thereto, and two adjacent pixels may have planar structures that are symmetrical to each other.

Figure 7:
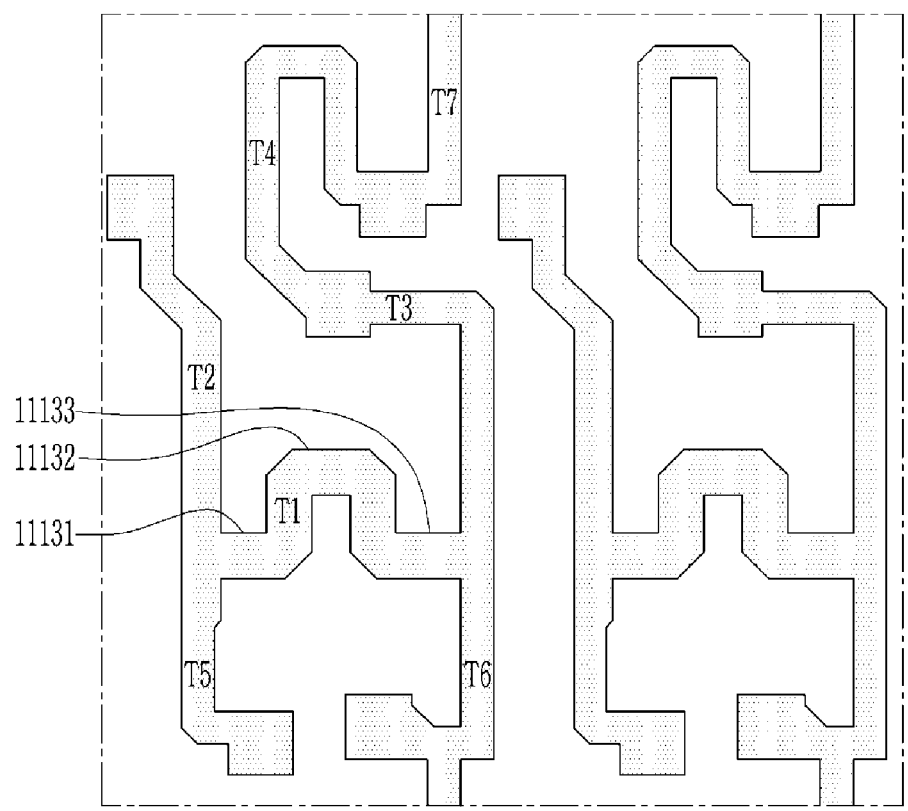
FIGS. 7, 8, 9, 10, and 11 are top plan views sequentially showing a part of a first display area of a display device according to an embodiment according to a manufacturing sequence.

First, as shown in FIG. 5 to FIG. 11, a semiconductor layer including a channel 11132, a first region 11131, and a second region 11133 of the first transistor T1 may be disposed on the first display area DA1 of the substrate 110 of the display device according to an embodiment. FIG. 7 shows the semiconductor layer. The semiconductor layer may further include a channel, a first region, and a second region of each of the second transistor T2, the third transistor T3, the fourth transistor T4, the fifth transistor T5, the sixth transistor T6, and the seventh transistor T7 as well as the first transistor T1.

The channel 11132 of the first transistor T1 may be formed with a bent shape in a plan view. However, the shape of the channel 11132 of the first transistor T1 is not limited thereto and may be variously changed. For example, the channel 11132 of the first transistor T1 may be bent into different shapes and may be formed with a bar shape. The first region 11131 and the second region 11133 of the first transistor T1 may be positioned on respective sides of the channel 11132 of the first transistor T1. The first region 11131 of the first transistor T1 extends up and down in a plan view, so that the portion extending downward may be connected to the second region of the fifth transistor T5 and the portion extending upward may be connected to the second region of the second transistor T2. The second region 11133 of the first transistor T1 extends up and down on the plane, so that the portion downwardly extended may be connected to the first region of the sixth transistor T6 and the portion upwardly extended may be connected to the first region of the third transistor T3.

A buffer layer 111 may be positioned between the substrate 110 and the semiconductor layer including the channel 11132, the first region 11131, and the second region 11133 of the first transistor T1. The buffer layer 111 may have a single layer or multi-layered structure. The buffer layer 111 may include an inorganic insulating material such as a silicon nitride ($SiN_X$), a silicon oxide ($SiO_X$), and a silicon oxynitride ($SiO_XN_Y$), or an organic insulating material. Also, a barrier layer may be positioned between the substrate 110 and the buffer layer 111. The barrier layer may have a single layer or multi-layered structure. The barrier layer may include an inorganic insulating material such as a silicon nitride ($SiN_X$), a silicon oxide ($SiO_X$), and a silicon oxynitride ($SiO_XN_Y$).

A first gate insulating layer 141 may be positioned on the semiconductor layer including the channel 11132, the first region 11131, and the second region 11133 of the first transistor T1. The first gate insulating layer 141 may have a single layer or multi-layered structure. The first gate insulating layer 141 may include an inorganic insulating material such as a silicon nitride ($SiN_X$), a silicon oxide ($SiO_X$), and a silicon oxynitride ($SiO_XN_Y$).

Figure 8:
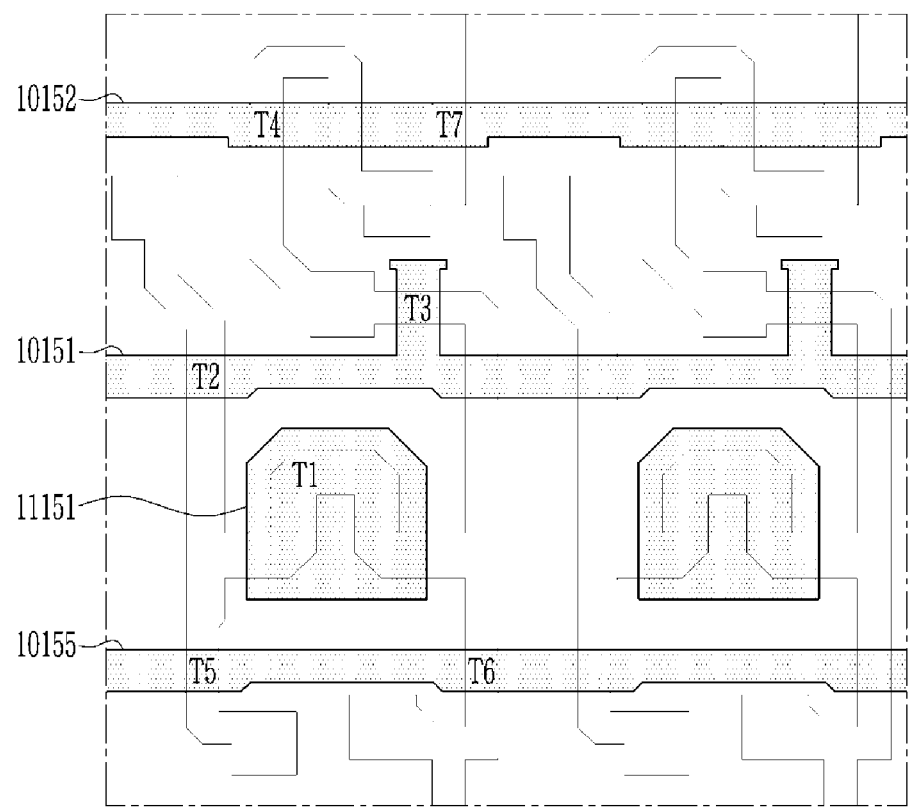

A first gate conductor including a gate electrode 11151 of the first transistor T1 may be positioned on the first gate insulating layer 141. FIG. 8 shows the semiconductor layer and the first gate conductor together.

The first gate conductor may have a single layer or multi-layered structure. The first gate conductor may include a metal material such as molybdenum (Mo), aluminum (Al), copper (Cu), and/or titanium (Ti), and the like. The first gate conductor may further include each gate electrode of the second transistor T2, the third transistor T3, the fourth transistor T4, the fifth transistor T5, the sixth transistor T6, and the seventh transistor T7 as well as the first transistor T1.

The gate electrode 11151 of the first transistor T1 may overlap the channel 11132 of the first transistor T1. The channel 11132 of the first transistor T1 may be covered by the gate electrode 11151 of the first transistor T1.

The first gate conductor may further include a first scan line 10151, a second scan line 10152, and a light emission control line 10155. The first scan line 10151, the second scan line 10152, and the light emission control line 10155 may extend in an approximate row direction. Each of the first scan line 10151, the second scan line 10152, and the light emission control line 10155 may be connected to a plurality of pixels. For example, a plurality of pixels disposed in the same raw may be connected to the same first scan line 10151, second scan line 10152, and light emission control line 10155. The first scan line 10151 may be connected to the gate electrode of the second transistor T2 and the gate electrode of the third transistor T3. The first scan line 10151 may be integrally formed with the gate electrode of the second transistor T2 and the gate electrode of the third transistor T3. The second scan line 10152 may be connected to the gate electrode of the fourth transistor T4. The second scan line 10152 may be integrally formed with the gate electrode of the fourth transistor T4. The second scan line 10152 may be connected to the gate electrode of the seventh transistor T7 positioned in the pixel of the previous stage. That is, the bypass control line connected to the seventh transistor T7 may be formed of the second scan line 10152 of the next stage. The light emission control line 10155 may be connected to the gate electrode of the fifth transistor T5 and the gate electrode of the sixth transistor T6. The light emission control line 10155 may be integrally formed with the gate electrode of the fifth transistor T5 and the gate electrode of the sixth transistor T6.

A doping process or a plasma treatment may be performed after forming the first gate conductor including the gate electrode 11151 of the first transistor T1. The part of the semiconductor layer covered by the first gate conductor is not doped or plasma-treated, and the part of the semiconductor layer that is not covered by the first gate conductor is doped or plasma-treated, thereby having the same characteristic as the conductor. Accordingly, the first region and the second region of each semiconductor layer of the first to seventh transistors T1, T2, T3, T4, T5, T6, and T7 may become the first electrode and the second electrode. In this case, the doping process may be performed with a p-type dopant, and the first transistor T1, the second transistor T2, the third transistor T3, the fourth transistor T4, the fifth transistor T5, the sixth transistor T6, and the seventh transistor T7 may have a p-type transistor characteristic.

A second gate insulating layer 142 may be positioned on the first gate conductor including the gate electrode 11151 of the first transistor T1 and the first gate insulating layer 141. The second gate insulating layer 142 may have a single layer or multi-layered structure. The second gate insulating layer 142 may include an inorganic insulating material such as a silicon nitride ($SiN_X$), a silicon oxide ($SiO_X$), and a silicon oxynitride ($SiO_XN_Y$).

Figure 9:
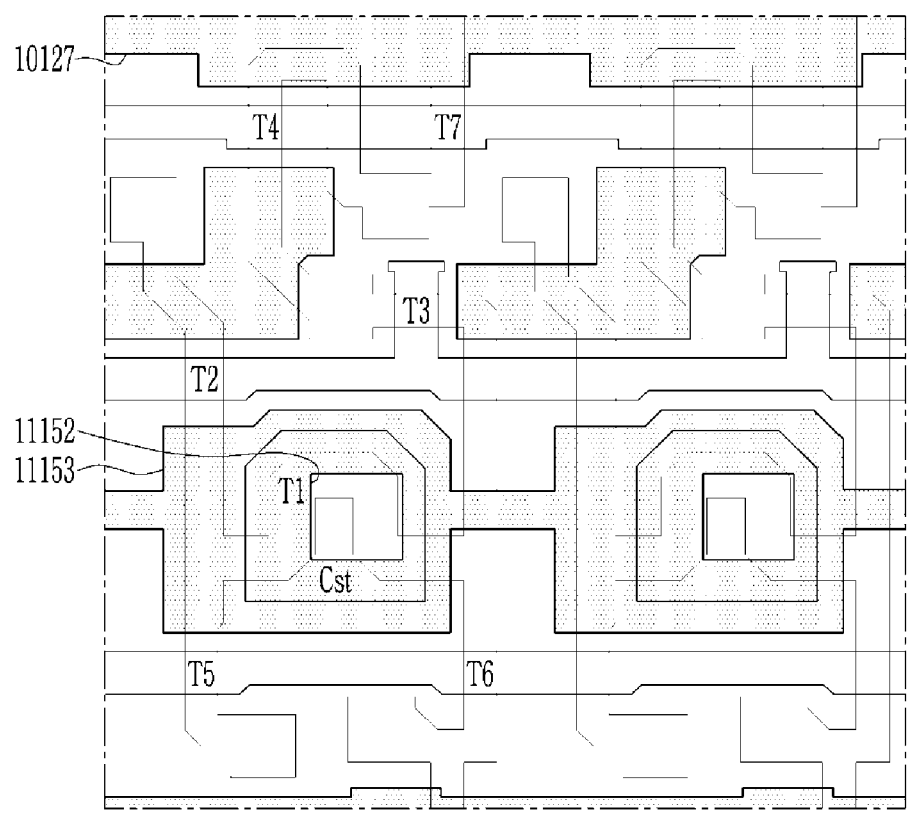

On the second gate insulating layer 142, a second gate conductor including a first storage electrode 11153 of the storage capacitor Cst may be positioned. FIG. 9 shows the semiconductor layer, the first gate conductor, and the second gate conductor together. The second gate conductor may have a single layer or multi-layered structure. The second gate conductor may include a metal material such as molybdenum (Mo), aluminum (Al), copper (Cu), and/or titanium (Ti).

The first storage electrode 11153 overlaps the gate electrode 11151 of the first transistor T1 to form the storage capacitor Cst. The first storage electrode 11153 of the storage capacitor Cst includes an opening 11152. The opening 11152 of the first storage electrode 11153 of the storage capacitor Cst may overlap the gate electrode 11151 of the first transistor T1.

The second gate conductor may further include an initialization voltage line 10127. The initialization voltage line 10127 may extend in the approximate row direction and may be connected from one end to the other end on the first display area DA1 of the substrate 110. The pixels adjacent in the row direction may be connected to the same initialization voltage line 10127.

A first interlayer insulating layer 161 may be positioned on the second gate conductor including the first storage electrode 11153 of the storage capacitor Cst. The first interlayer insulating layer 161 may have a single layer or multi-layered structure. The first interlayer insulating layer 161 may include an inorganic insulating material such as a silicon nitride ($SiN_X$), a silicon oxide ($SiO_X$), and a silicon oxynitride ($SiO_XN_Y$).

A third gate conductor including a data line 1171, a driving voltage line 1172, and a connection electrode 11175 may be disposed on the first interlayer insulating layer 161. FIG. 10 shows the semiconductor layer, the first gate conductor, the second gate conductor, and the third gate conductor together. The third gate conductor may have a single layer or multi-layered structure. The third gate conductor may include a metal material such as molybdenum (Mo), aluminum (Al), copper (Cu), and/or titanium (Ti).

The data line 1171 and the driving voltage line 1172 may extend in the approximate vertical direction. The data line 1171 may be connected to the second transistor T2. The driving voltage line 1172 may be connected to the fifth transistor T5. Also, the driving voltage line 1172 may be connected to the first storage electrode 11153.

The connection electrode 11175 may connect the first transistor T1, the third transistor T3, and the fourth transistor T4. One end of the connection electrode 11175 may overlap the gate electrode 11151 of the first transistor T1. The first interlayer insulating layer 161 may include an opening 11161 overlapping the connection electrode 11175 and the gate electrode 11151 of the first transistor T1. The connection electrode 11175 may be connected to the gate electrode 11151 of the first transistor T1 through the opening 11161 and the opening 11152 of the first storage electrode 11153. The other end of the connection electrode 11175 may overlap the second region of the third transistor T3 and the second region of the fourth transistor T4. The first interlayer insulating layer 161 may include an opening 11162 overlapping the connection electrode 11175, the second region of the third transistor T3, and the second region of the fourth transistor T4. The connection electrode 11175 may be connected to the second region of the third transistor T3 and the second region of the fourth transistor T4 through the opening 11162. Therefore, the gate electrode 11151 of the first transistor T1 may be connected to the second region of the third transistor T3 and the second region of the fourth transistor T4 by the connection electrode 11175.

The third gate conductor may additionally include other connection electrodes. By this connection electrode, the first region of the fourth transistor T4 and the second region of the seventh transistor T7 may be connected to the initialization voltage line 10127. In addition, there may be a connection electrode overlapping the sixth transistor T6 and connected to the second region of the sixth transistor T6.

A first passivation layer 180 may be disposed on the third gate conductor including the data line 1171, the driving voltage line 1172, and the connection electrode 11175. The first passivation layer 180 may include a lower passivation layer 180a and an upper passivation layer 180b. The upper passivation layer 180b may be disposed on the lower passivation layer 180a. The first passivation layer 180 may include inorganic insulating materials such as a silicon nitride ($SiN_x$), a silicon oxide ($SiO_x$), and a silicon oxynitride (SiON), and/or organic insulating materials such as a polyimide, an acryl-based polymer, and a siloxane-based polymer. At this time, the lower passivation layer 180a of the first passivation layer 180 may be made of an inorganic insulating material, and the upper passivation layer 180b may be made of an organic insulating material.

The second passivation layer 182 may be disposed on the first passivation layer 180. The second passivation layer 182 may include an organic insulating material such as a generally-used polymer such as poly(methyl methacrylate) (PMMA) or polystyrene (PS), a polymer derivative having a phenol-based group, an acryl-based polymer, an imide-based polymer, a polyimide, an acryl-based polymer, and a siloxane-based polymer.

The anode 1191 may be positioned on the second passivation layer 182. FIG. 11 shows the semiconductor layer, the first gate conductor, the second gate conductor, the third gate conductor, and the anode 1191 together.

The anode 1191 may be connected to the sixth transistor T6 and may receive the output current of the first transistor T1. The anode 1191 may overlap the first pixel circuit unit PC1 connected thereto.

A partition wall 350 may be positioned on the anode 1191. The partition wall 350 may include a pixel opening 1351, and the pixel opening 1351 of the partition wall 350 may overlap the anode 1191. A light-emitting element layer 1370 may be positioned in the pixel opening 1351 of the partition wall 350. The light-emitting element layer 1370 may overlap the anode 1191. A cathode 270 may be positioned on the light-emitting element layer 1370 and the partition wall 350. The anode 1191, the light-emitting element layer 1370, and the cathode 270 may constitute the first light-emitting element ED1.

Figure 14:
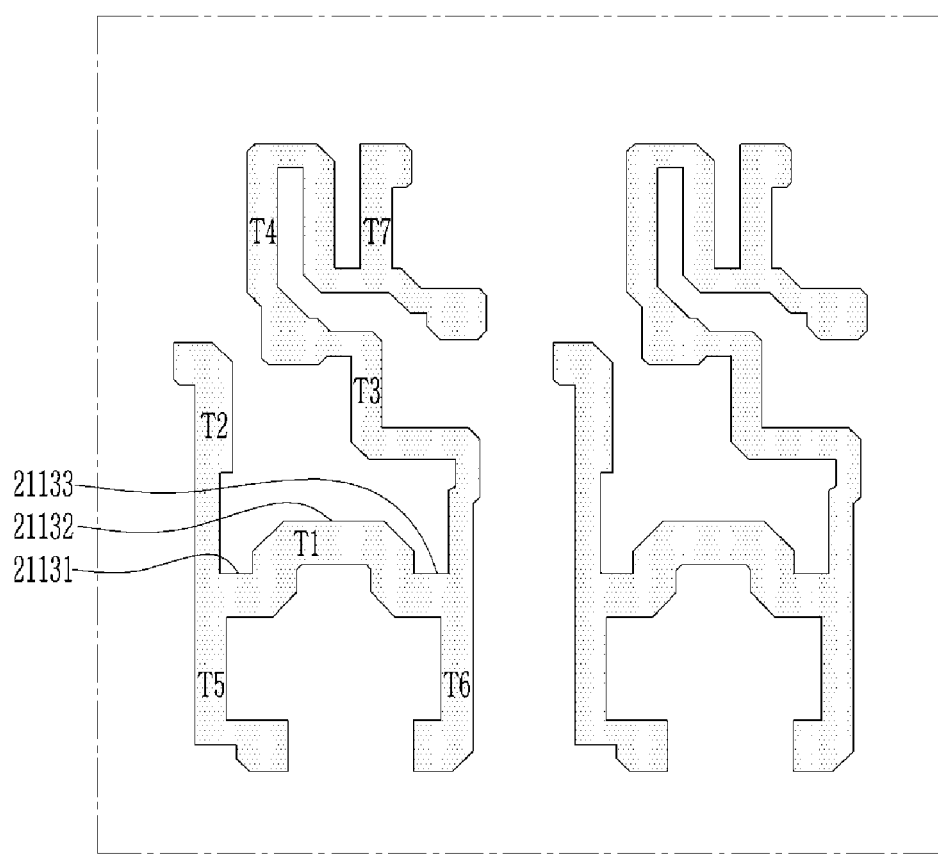
FIGS. 14, 15, 16, 17, 18, 19, 20, and 21 are top plan views sequentially showing a part of a second display area of a display device according to an embodiment according to a manufacturing sequence.

Next, as shown in FIG. 12 to FIG. 21, the semiconductor layer including the channel 21132, the first region 21131, and the second region 21133 of the first transistor T1 may be positioned on the second display area DA2 of the substrate 110 of the display device according to an embodiment. FIG. 14 shows the semiconductor layer. The channel 21132, the first region 21131, and the second region 21133 of the first transistor T1 of the pixel positioned in the second display area DA2 may be positioned on the same layer as the channel 11132, the first region 11131, and the second region 11133 of the first transistor T1 of the pixel positioned in the first display area DA1. The semiconductor layer may further include a channel, a first region, and a second region of each of the second transistor T2, the third transistor T3, the fourth transistor T4, the fifth transistor T5, the sixth transistor T6, and the seventh transistor T7 as well as the first transistor T1.

The channel 21132 of the first transistor T1 may have a bent shape in a plan view. However, the shape of the channel 21132 of the first transistor T1 is not limited thereto, and may be variously changed. For example, the channel 21132 of the first transistor T1 may be bent to a different shape or may be formed in a rod shape. The first region 21131 and second region 21133 of the first transistor T1 may be positioned on respective sides of the channel 21132 of the first transistor T1. The first region 21131 of the first transistor T1 extends up and down in a plan view, so that the portion downwardly extended may be connected to the second region of the fifth transistor T5 and the portion upwardly extended may be connected to the second region of the second transistor T2. The second region 21133 of the first transistor T1 extends up and down in a plan view, so that the portion downwardly extended may be connected to the first region of the sixth transistor T6 and the portion upwardly extended may be connected to the first region of the third transistor T3.

As in the first display area DA1, also in the second display area DA2, the buffer layer 111 may be positioned between the substrate 110 and the semiconductor layer including the channel 21132, the first region 21131, and the second region 21133 of the first transistor T1.

The first gate insulating layer 141 may be positioned on the semiconductor layer including the channel 21132, the first region 21131, and the second region 21133 of the first transistor T1.

Figure 15:
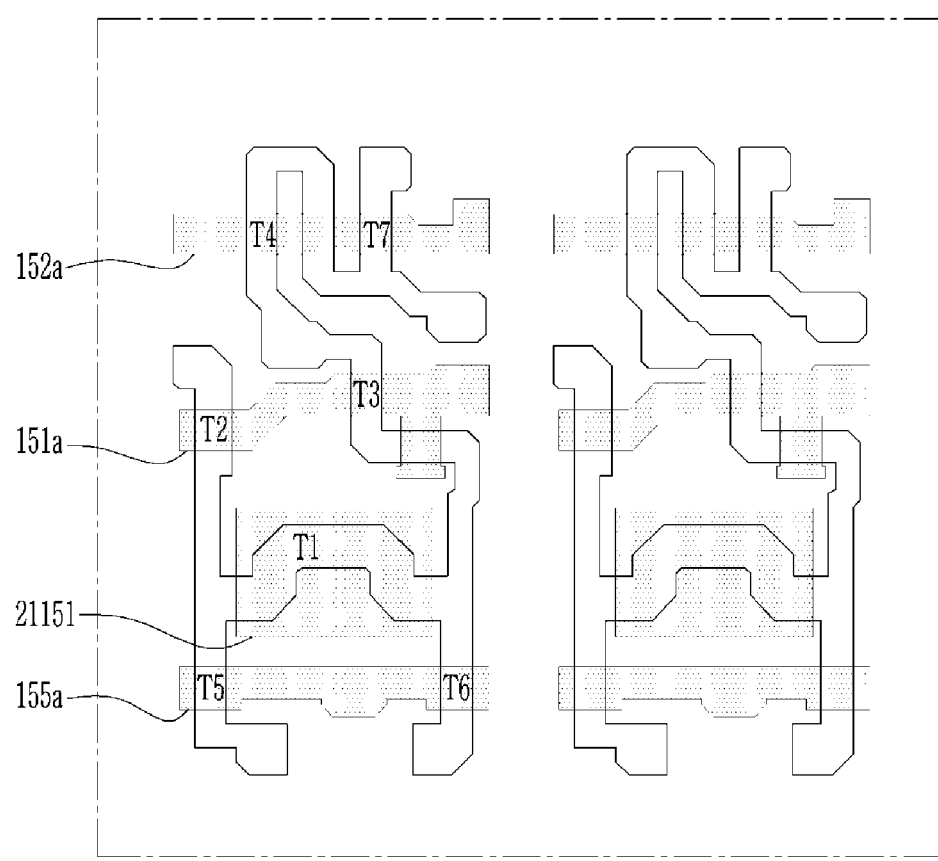

A first gate conductor including the gate electrode 21151 of the first transistor T1 may be positioned on the first gate insulating layer 141. FIG. 15 shows the semiconductor layer and the first gate conductor together. The gate electrode 21151 of the first transistor T1 of the pixel positioned in the second display area DA2 may be positioned on the same layer as the gate electrode 11151 of the first transistor T1 of the pixel positioned in the first display area DA1. The first gate conductor may further include a gate electrode of each of the second transistor T2, the third transistor T3, the fourth transistor T4, the fifth transistor T5, the sixth transistor T6, and the seventh transistor T7 as well as the first transistor T1.

The gate electrode 21151 of the first transistor T1 may overlap the channel 21132 of the first transistor T1. The channel 21132 of the first transistor T1 is covered by the gate electrode 21151 of the first transistor T1.

The first gate conductor may further include a lower first scan line 151a, a lower second scan line 152a, and a lower light emission control line 155a. The lower first scan line 151a, the lower second scan line 152a, and the lower light emission control line 155a may be approximately extended in a row direction. The lower first scan line 151a, the lower second scan line 152a, and the lower light emission control line 155a may be independently positioned at two adjacent pixels, respectively. That is, the lower first scan line 151a positioned at the left pixel may be positioned apart from the lower first scan line 151a positioned at the right pixel. In addition, the lower second scan line 152a positioned at the left pixel may be positioned apart from the lower second scan line 152a positioned at the right pixel. In addition, the lower light emission control line 155a positioned on the left pixel may be positioned apart from the lower light emission control line 155a positioned on the right pixel. The lower first scan line 151a may be connected to the gate electrode of the second transistor T2 and the gate electrode of the third transistor T3. The lower first scan line 151a may be integrated with the gate electrode of the second transistor T2 and the gate electrode of the third transistor T3. The lower second scan line 152a may be connected to the gate electrode of the fourth transistor T4. The lower second scan line 152a may be integrated with the gate electrode of the fourth transistor T4. The lower second scan line 152a may be connected to the gate electrode of the seventh transistor T7 positioned at the pixel of the previous stage. That is, the bypass control line connected to the seventh transistor T7 may be formed with the lower second scan line 152a at the rear stage. The lower light emission control line 155a may be connected to the gate electrode of the fifth transistor T5 and the gate electrode of the sixth transistor T6. The lower light emission control line 155a may be integrated with the gate electrode of the fifth transistor T5 and the gate electrode of the sixth transistor T6.

After forming the first gate conductor including the gate electrode 21151 of the first transistor T1, the doping process or plasma treatment may be performed. The part of the semiconductor layer that is covered by the first gate conductor is not doped or plasma-treated, and the part of the semiconductor layer that is not covered by the first gate conductor is doped or plasma-treated to have the same characteristics as the conductor. Therefore, the first and second regions of the first to seventh transistors T1, T2, T3, T4, T5, T6, and T7 of the semiconductor layer may be the first electrode and the second electrode, respectively. At this time, the doping process may be performed with a p-type dopant, and the first transistor T1, the second transistor T2, the third transistor T3, the fourth transistor T4, the fifth transistor T5, the sixth transistor T6, and the seventh transistor T7 may have a p-type transistor characteristic.

The second gate insulating layer 142 may be positioned on the first gate conductor including the gate electrode 21151 of the first transistor T1 and the first gate insulating layer 141.

Figure 16:
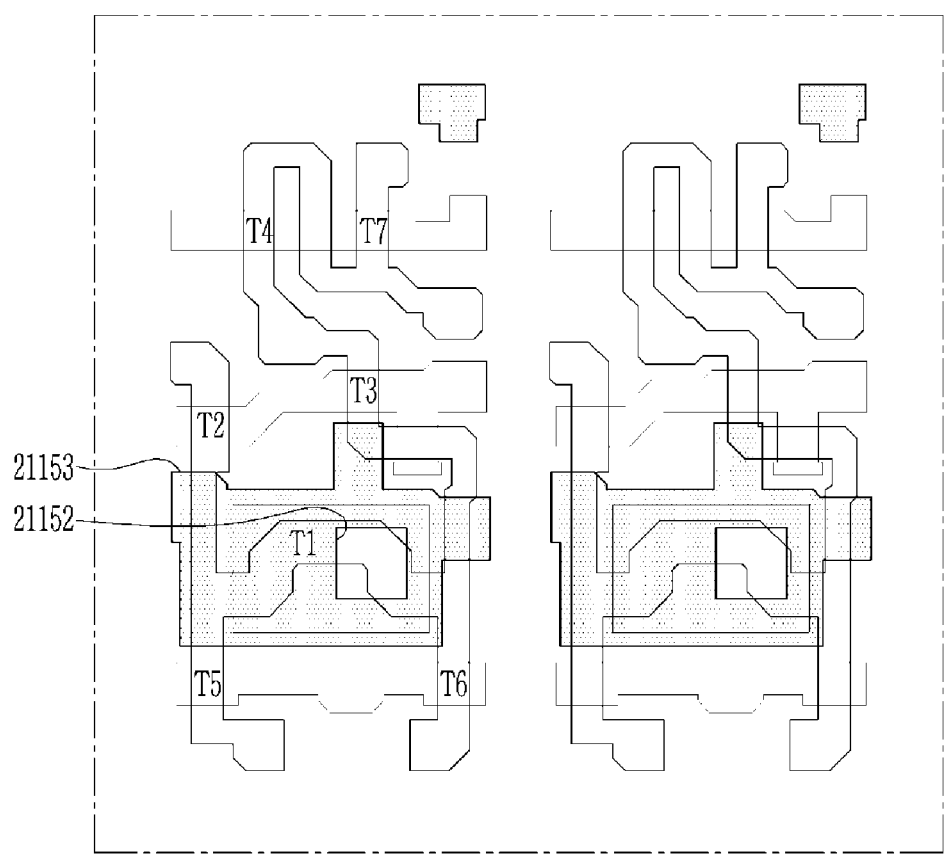

The second gate conductor including the first storage electrode 21153 of the storage capacitor Cst may be positioned on the second gate insulating layer 142. FIG. 16 shows the semiconductor layer, the first gate conductor, and the second gate conductor together. The first storage electrode 21153 of the pixel positioned in the second display area DA2 may be positioned on the same layer as the first storage electrode 11153 of the pixel positioned in the first display area DA1.

The first storage electrode 21153 overlaps the gate electrode 21151 of the first transistor T1 to form the storage capacitor Cst. An opening 21152 is formed in the first storage electrode 21153 of the storage capacitor Cst. The opening 21152 of the first storage electrode 21153 of the storage capacitor Cst may overlap the gate electrode 21151 of the first transistor T1.

The first interlayer insulating layer 161 may be positioned on the second gate conductor including the first storage electrode 21153 of the storage capacitor Cst.

The first to seventh transistors T1, T2, T3, T4, T5, T6, and T7, the storage capacitor Cst, the lower first scan line 151a, the lower second scan line 152a, and the lower light emission control line 155a included in the second pixel circuit unit PC2 of each pixel positioned in the second display area DA2 may be positioned in a pixel circuit region PCR. The pixel circuit region PCR may be an approximate quadrangle. However, the shape of the pixel circuit region PCR is not limited thereto, and may be variously changed. The pixel circuit regions PCR of two adjacent pixels are distinguished from each other and do not overlap. That is, the pixel circuit region PCR of the left pixel and the pixel circuit region PCR of the right pixel do not overlap each other.

Figure 17:
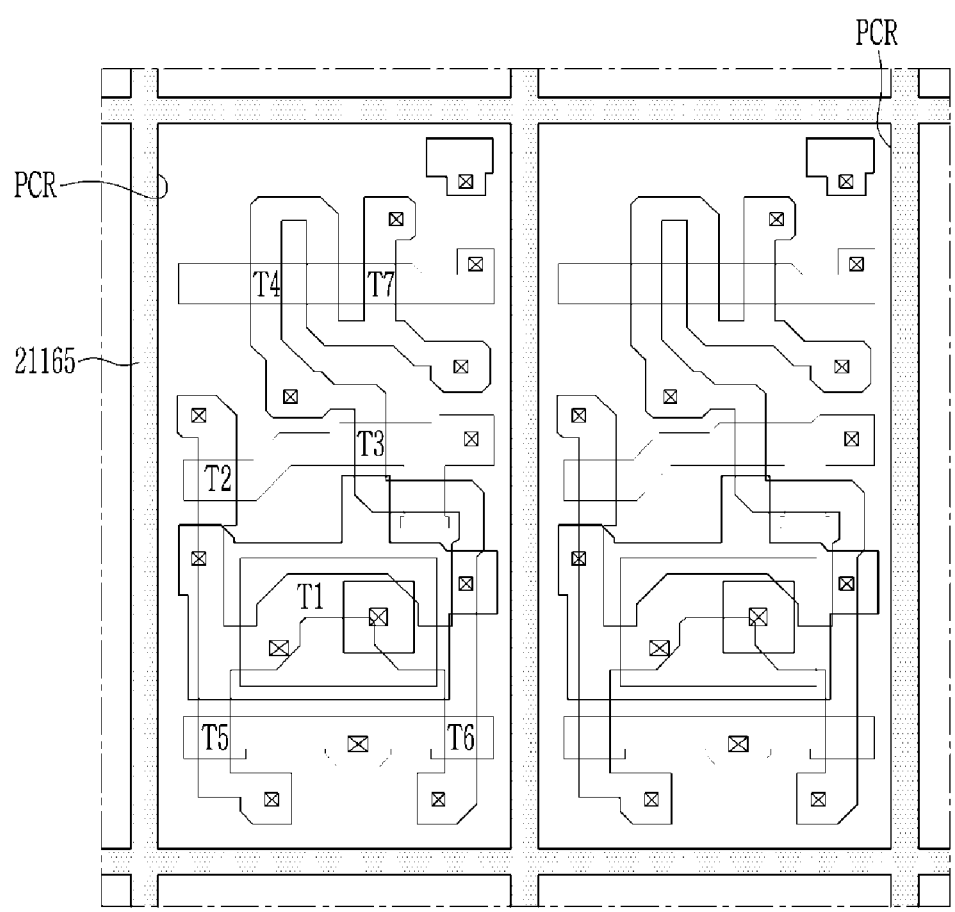

The first interlayer insulating layer 161 may include an opening 21165. FIG. 17 shows the semiconductor layer, the first gate conductor, the second gate conductor, and the opening 21165 of the first interlayer insulating layer 161. A plurality of pixel circuit region PCR may be identified by the opening 21165. That is, the opening 21165 may be positioned between a plurality of pixel circuit regions PCR, and may be formed to surround the edge of the pixel circuit region PCR. The opening 21165 may have a lattice shape in a plan view. The opening 21165 may be formed not only in the first interlayer insulating layer 161 but also in the buffer layer 111, the first gate insulating layer 141, and the second gate insulating layer 142. However, the present invention is not limited thereto, and the opening 21165 may be formed in the first interlayer insulating layer 161 and the second gate insulating layer 142 and may not be formed in the buffer layer 111 and the first gate insulating layer 141. In addition, the opening 21165 may be formed on the first interlayer insulating layer 161, the second gate insulating layer 142, and the first gate insulating layer 141, and may not be formed on the buffer layer 111. The semiconductor layers, the first gate conductors, and the second gate conductors positioned in the different pixel circuit regions PCR are not directly connected to each other but are separated from each other.

Figure 18:
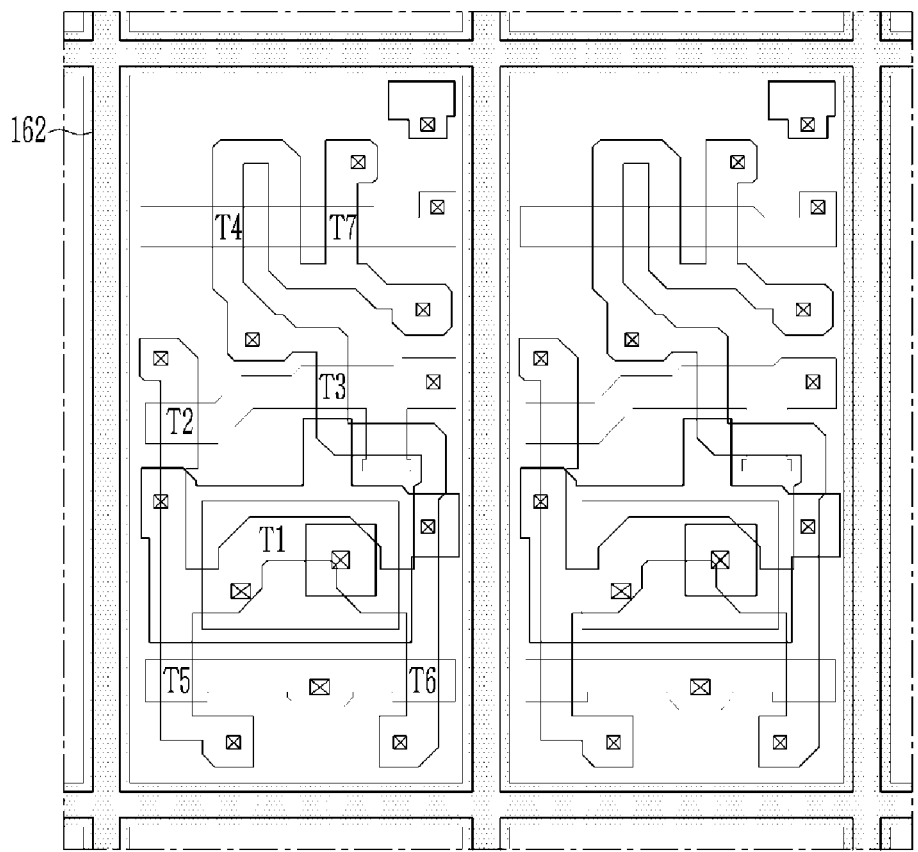

The second interlayer insulating layer 162 may be positioned within the opening 21165 of the first interlayer insulating layer 161. FIG. 18 shows the semiconductor layer, the first gate conductor, the second gate conductor, the opening 21165 of the first interlayer insulating layer 161, and the second interlayer insulating layer 162.

The second interlayer insulating layer 162 may have a single layer or multi-layered structure. The second interlayer insulating layer 162 may include an organic insulating material such as a generally-used polymer such as poly (methyl methacrylate) (PMMA) or polystyrene (PS), a polymer derivative having a phenol-based group, an acryl-based polymer, an imide-based polymer, a polyimide, an acryl-based polymer, and a siloxane-based polymer.

The second interlayer insulating layer 162 may be formed to fill the opening 21165. A plurality of pixel circuit regions PCR may be distinguished by the second interlayer insulating layer 162. That is, the second interlayer insulating layer 162 may be positioned between a plurality of pixel circuit regions PCR and may be formed to surround the edge of the pixel circuit region PCR in a plan view. The opening 21165 may have a lattice shape in a plan view. By forming the opening 21165 in the first interlayer insulating layer 161, the second gate insulating layer 142, the first gate insulating layer 141, and the buffer layer 111 made of the inorganic material and positioned in the second interlayer insulating layer 162 made of the organic material in the opening 21165, each pixel may be formed as an island type. Therefore, even if an impact is applied from the outside and damage occurs in the first interlayer insulating layer 161, etc., since a plurality of pixel circuit regions PCR have an independent structure by the second interlayer insulating layer 162 made of the organic material, it may be prevented from affecting other adjacent pixels. In other words, it is possible to prevent cracks generated in any one region from propagating in the horizontal direction. In addition, the opening 21165 is formed in the second interlayer insulating layer 162 positioned in the second display area DA2 including the bending area BA and the second interlayer insulating layer 162 is formed to fill the opening 21165, so that the bending area BA may have an advantageous structure for bending. Accordingly, when bending the bending area BA, a curvature of the bending area BA may be minimized.

Figure 19:
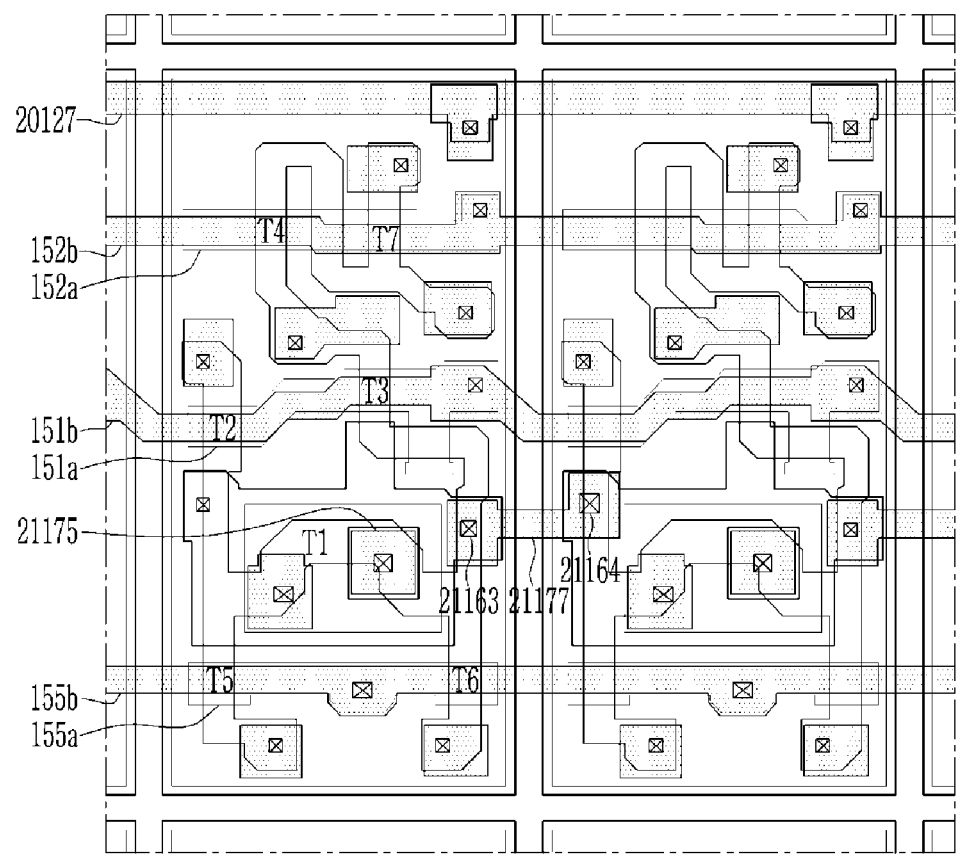

A third gate conductor including a bridge electrode 21177 and a first connection electrode 21175 may be positioned on the first interlayer insulating layer 161 and the second interlayer insulating layer 162. FIG. 19 shows the semiconductor layer, the first gate conductor, the second gate conductor, the opening 21165 of the first interlayer insulating layer 161, the second interlayer insulating layer 162, and the third gate conductor together.

The bridge electrode 21177 may connect the first storage electrodes 21153 disposed in two adjacent pixels. For example, the bridge electrode may connect the first storage electrode 21153 positioned on the left pixel and the first storage electrode 21153 positioned on the right pixel. One end of the bridge electrode 21177 may overlap the first storage electrode 21153 positioned on the left pixel, and the other end may overlap the first storage electrode 21153 positioned on the right pixel. The first interlayer insulating layer 161 may include an opening 21163 overlapping the bridge electrode 21177 and the first storage electrode 21153 positioned on the left pixel. The bridge electrode 21177 may be connected to the first storage electrode 21153 positioned on the left pixel through the opening 21163. The first interlayer insulating layer 161 may include an opening 21164 overlapping the bridge electrode 21177 and the first storage electrode 21153 positioned on the right pixel. The bridge electrode 21177 may be connected to the first storage electrode 21153 positioned on the right pixel through the opening 21164. Therefore, the first storage electrode 21153 positioned on the left pixel and the first storage electrode 21153 positioned on the right pixel may be connected by the bridge electrode 21177.

The bridge electrode 21177 may overlap the opening 21165 of the first interlayer insulating layer 161 and the second interlayer insulating layer 162. That is, the bridge electrode 21177 may connect the first storage electrodes 21153 positioned in the pixel circuit regions PCR of two adjacent pixels separated by the opening 21165 of the first interlayer insulating layer 161 and the second interlayer insulating layer 162 to each other. Therefore, the same voltage may be applied to the first storage electrodes 21153 adjacent to the left and right. The third gate conductor containing the bridge electrode 21177 may be made of a flexible metal material. The bridge electrode 21177 is positioned on the second display area DA2 including the bending area BA, and the bending area BA may have an advantageous structure for bending.

The first connection electrode 21175 may be connected to the first transistor T1. The first interlayer insulating layer 161 may include an opening 21161 overlapping the first connection electrode 21175 and the gate electrode 21151 of the first transistor T1. The opening 21161 may be further formed in the second gate insulating layer 142. The first connection electrode 21175 may be connected to the gate electrode 21151 of the first transistor T1 through the opening 21161 and the opening 21152 of the first storage electrode 21153.

The third gate conductor may further include an upper first scan line 151b, an upper second scan line 152b, an upper light emission control line 155b, and an initialization voltage line 20127.

The upper first scan line 151b may overlap at least a part of the lower first scan line 151a and may be connected to the lower first scan line 151a. The upper first scan line 151b forms a first scan line 20151 together with the lower first scan line 151a. The upper first scan line 151b may extend approximately in a row direction, and may lead from one end to the other end above the second display area DA2 of the substrate 110. The lower first scan lines 151a of the pixels adjacent in the row direction may be connected to the same upper first scan line 151b. The scan signal GW applied to the upper first scan line 151b may be applied to the gate electrode of the second transistor T2 and the gate electrode of the third transistor T3 through the lower first scan line 151a.

The first scan line 20151 positioned in the second display area DA2 may be connected to the first scan line 10151 positioned in the first display area DA1. At this time, at least one of the lower first scan line 151a and the upper first scan line 151b of the first scan line 20151 positioned in the second display area DA2 may be connected to the first scan line 10151 positioned in the first display area DA1. For example, the lower first scan line 151a positioned in the second display area DA2 may be connected to the first scan line 10151 positioned in the first display area DA1. The lower first scan line 151a positioned in the second display area DA2 and the first scan line 10151 positioned in the first display area DA1 may be formed of a first gate conductor and may be positioned on the same layer. An opening may not be formed in the first interlayer insulating layer 161 at the boundary between the first display area DA1 and the second display area DA2, so the lower first scan line 151a positioned in the second display area DA2 be directly connected to the first scan line 10151 positioned in the first display area DA1. As another example, the upper first scan line 151b positioned in the second display area DA2 may be connected to the first scan line 10151 positioned in the first display area DA1. The upper first scan line 151b positioned in the second display area DA2 may be positioned on a different layer from the first scan line 10151 positioned in the first display area DA1. The upper first scan line 151b positioned in the second display area DA2 may be made of a third gate conductor, and the first scan line 10151 positioned in the first display area DA1 may be made of a first gate conductor. The first interlayer insulating layer 161 and the second gate insulating layer 142 may include an opening overlapping the upper first scan line 151b and the first scan line 10151, and the upper first scan line 151b may be connected to the first scan line 10151 through the opening.

The upper second scan line 152b may overlap at least a portion of the lower second scan line 152a and may be connected to the lower second scan line 152a. The upper second scan line 152b forms the second scan line 20152 with the lower second scan line 152a. The upper second scan line 152b may extend approximately in a row direction and may lead from one end to the other end above the second display area DA2 of the substrate 110. The lower second scan lines 152a of the pixels adjacent in the row direction may be connected to the same upper second scan line 152b. The scan signal GI applied to the upper second scan line 152b may be applied to the gate electrode of the fourth transistor T4 through the lower second scan line 152a.

The second scan line 20152 positioned in the second display area DA2 may be connected to the second scan line 10152 positioned in the first display area DA1. At this time, at least one of the lower second scan line 152a and the upper second scan line 152b of the second scan line 20152 positioned in the second display area DA2 may be connected to the second scan line 10152 positioned in the first display area DA1. For example, the lower second scan line 152a positioned in the second display area DA2 may be connected to the second scan line 10152 positioned in the first display area DA1. The lower second scan line 152a positioned in the second display area DA2 and the second scan line 10152 positioned in the first display area DA1 may be formed of a first gate conductor and may be positioned on the same layer. An opening may not be formed in the first interlayer insulating layer 161 at the boundary between the first display area DA1 and the second display area DA2, so the lower second scan line 152a located on the second display area DA2 may be directly connected to the second scan line 10152 located on the first display area DA1. As another example, the upper second scan line 152b positioned in the second display area DA2 may be connected to the second scan line 10152 positioned in the first display area DA1. The upper second scan line 152b positioned in the second display area DA2 may be positioned on a different layer from the second scan line 10152 positioned in the first display area DA1. The upper second scan line 152b positioned in the second display area DA2 may be made of a third gate conductor, and the second scan line 10152 positioned in the first display area DA1 may be made of a first gate conductor. The first interlayer insulating layer 161 and the second gate insulating layer 142 may include an opening overlapping the upper second scan line 152b and the second scan line 10152, and the upper second scan line 152b may be connected to the second scan line 10152 through the opening.

The upper light emission control line 155b may overlap at least a portion of the lower light emission control line 155a and may be connected to the lower light emission control line 155a. The upper light emission control line 155b forms the light emission control line 20155 together with the lower light emission control line 155a. The upper light emission control line 155b may extend approximately in a row direction and may lead from one end to the other end above the second display area DA2 of the substrate 110. The lower light emission control lines 155a of the pixels adjacent in the row direction may be connected to the same upper light emission control line 155b. The light emission control signal EM applied to the upper light emission control line 155b may be applied to the gate electrode of the fifth transistor T5 and the gate electrode of the sixth transistor T5 through the lower light emission control line 155a.

The light emission control line 20155 positioned in the second display area DA2 may be connected to the light emission control line 10155 positioned in the first display area DA1. At this time, at least one of the lower light emission control line 155a and the upper light emission control line 155b of the light emission control line 20155 positioned in the second display area DA2 may be connected to the light emission control line 10155 positioned in the first display area DA1. For example, the lower light emission control line 155a positioned in the second display area DA2 may be connected to the light emission control line 10155 positioned in the first display area DA1. The lower light emission control line 155a positioned in the second display area DA2 and the light emission control line 10155 positioned in the first display area DA1 may be formed of a first gate conductor and may be positioned on the same layer. An opening may not be formed in the first interlayer insulating layer 161 at the boundary between the first display area DA1 and the second display area DA2, so the lower light emission control line 155a positioned in the second display area DA2 may be directly connected to the light emission control line 10155 positioned in the first display area DA1. As another example, the upper second scan line 152b positioned in the second display area DA2 may be connected to the light emission control line 10155 positioned in the first display area DA1. The upper second scan line 152b positioned in the second display area DA2 may be positioned in a different layer from the light emission control line 10155 positioned in the first display area DA1. The upper second scan line 152b positioned in the second display area DA2 may be made of a third gate conductor, and the light emission control line 10155 positioned in the first display area DA1 may be made of a first gate conductor. The first interlayer insulating layer 161 and the second gate insulating layer 142 may include an opening overlapping the upper second scan line 152b and the light emission control line 10155, and the upper second scan line 152b may be connected to the light emission control line 10155 through the opening.

The initialization voltage line 20127 may extend approximately in the row direction and may lead from one end to the other end above the second display area DA2 of the substrate 110. The pixels adjacent in the row direction may be connected to the same initialization voltage line 20127. The initialization voltage Vint applied to the initialization voltage line 20127 may be applied to the first region of the fourth transistor T4 and the second region of the seventh transistor T7.

The initialization voltage line 20127 positioned in the second display area DA may be connected to the initialization voltage line 10127 positioned in the first display area DA1. The initialization voltage line 20127 positioned in the second display area DA may be positioned on a different layer than the initialization voltage line 10127 positioned in the first display area DA1.

The initialization voltage line 20127 positioned in the second display area DA) may be made of a third gate conductor, and the initialization voltage line 10127 positioned in the first display area DA1 may be made of a second gate conductor. The first interlayer insulating layer 161 may include an opening overlapping the initialization voltage line 10127 and the initialization voltage line 20127, and the initialization voltage line 20127 positioned in the second display area DA may be connected to the initialization voltage line 10127 positioned in the first display area DA1 through the opening.

The upper first scan line 151b, the upper second scan line 152b, the upper light emission control line 155b, and the initialization voltage line 20127 may overlap the opening 21165 of the first interlayer insulating layer 161 and the second interlayer insulating layer 162. The upper first scan line 151b may connect the lower first scan lines 151a positioned in the pixel circuit regions PCR of the adjacent pixels in the row direction. The upper second scan line 152b may connect the lower second scan lines 152a positioned in the pixel circuit regions PCR of the adjacent pixels in the row direction. The upper light emission control line 155b may connect the lower light emission control lines 155a positioned in the pixel circuit regions PCR of the adjacent pixels in the row direction.

A first passivation layer 180 may be positioned on the third gate conductor including the bridge electrode 21177 and the first connection electrode 21175. The first passivation layer 180 may include a lower passivation layer 180a and an upper passivation layer 180b disposed on the lower passivation layer.

The lower passivation layer 180a of the first passivation layer 180 may include an opening 21183. The opening 21183 of the lower passivation layer 180a of the first passivation layer 180 may overlap the opening 21165 of the first interlayer insulating layer 161. In addition, the opening 21183 of the lower passivation layer 180a of the first passivation layer 180 may overlap the second interlayer insulating layer 162. That is, the opening 21183 of the lower passivation layer 180a of the first passivation layer 180 may be positioned between a plurality of pixel circuit regions PCR and may be formed to surround the edge of the pixel circuit region PCR. The upper passivation layer 180b may be positioned within the opening 21183 of the lower passivation layer 180a. The upper passivation layer 180b fills the opening 21183 of the lower passivation layer 180a and is positioned above the lower passivation layer 180a, thereby flattening the upper surface of the lower passivation layer 180a.

Figure 20:
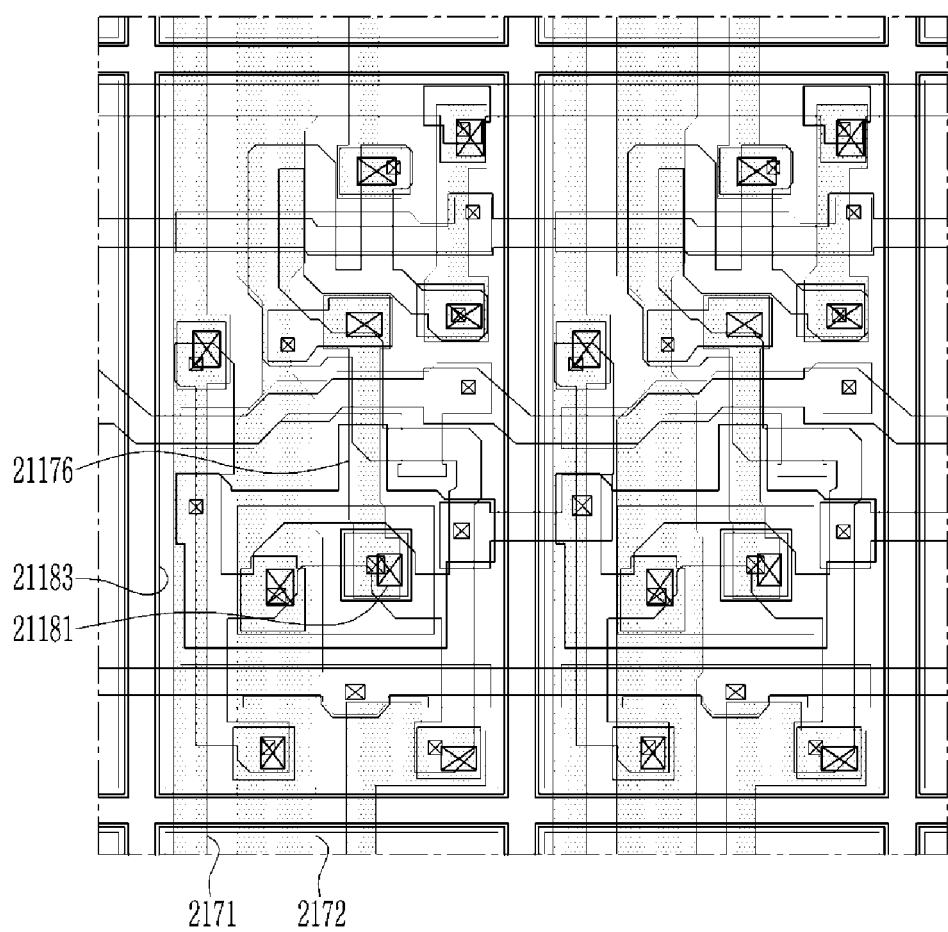

On the first passivation layer 180, a data conductor including a data line 2171, a driving voltage line 1172, and a second connection electrode 21176 may be positioned. FIG. 20 shows the semiconductor layer, the first gate conductor, the second gate conductor, the opening 21165 of the first interlayer insulating layer 161, the second interlayer insulating layer 162, the third gate conductor, and the data conductor together. The data conductor may have a single layer or multi-layered structure. The data conductors may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The data line 2171 and the driving voltage line 2172 may extend approximately in a vertical direction. The data line 2171 may be connected to the second transistor T2. The driving voltage line 2172 may be connected to the fifth transistor T5. In addition, the driving voltage line 2172 may be connected to the first storage electrode 21153.

The second connection electrode 21176 may connect the first transistor T1, the third transistor T3 and the fourth transistor T4. One end of the second connection electrode 21176 may overlap the first connection electrode 21175. The first passivation layer 180 may include an opening 21181 overlapping the first connection electrode 21175 and the second connection electrode 21176. The second connection electrode 21176 may be connected to the first connection electrode 21175 through the opening 21181. Since the first connection electrode 21175 is connected to the gate electrode 21151 of the first transistor T1, the second connection electrode 21176 may be connected to the gate electrode 21151 of the first transistor T1 through the first connection electrode 21175. The other end of the second connection electrode 21176 may overlap the second region of the third transistor T3 and the second region of the fourth transistor T4. The second connection electrode 21176 may be connected to the second region of the third transistor T3 and the second region of the fourth transistor T4. Therefore, the gate electrode 21151 of the first transistor T1 may be connected to the second region of the third transistor T3 and the second region of the fourth transistor T4 by the second connection electrode 21176.

A second passivation layer 182 may be positioned on the data conductor including the data line 2171, the driving voltage line 1172, and the second connection electrode 21176.

Figure 21:
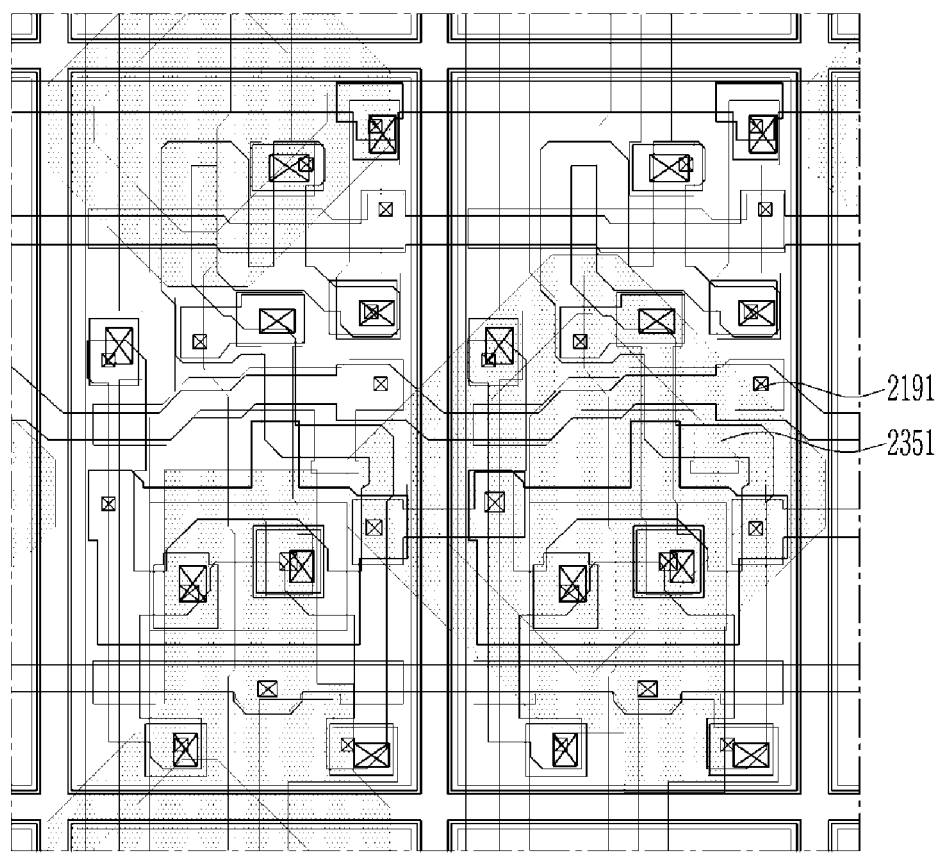

The anode 2191 may be positioned on the second passivation layer 182. FIG. 21 shows the semiconductor layer, the first gate conductor, the second gate conductor, the opening 21165 of the first interlayer insulating layer 161, the second interlayer insulating layer 162, the third gate conductor, and the data conductor and anode 2191.

The anode 2191 may be connected to the sixth transistor T6 and may receive the output current of the first transistor T1. The anode 2191 may also overlap the second pixel circuit unit PC2, which is connected thereto. At this time, a part of the anode 2191 overlaps the second pixel circuit unit PC2 and is connected to the second pixel circuit unit PC2, and most of the remaining regions may not overlap the second pixel circuit unit PC2. That is, as described above, the light emission region of the second light-emitting element ED2 does not overlap the second pixel circuit unit PC2 connected thereto, but may overlap the second pixel circuit unit PC2 that is not connected thereto.

A partition wall 350 may be positioned on the anode 2191. The partition wall 350 has a pixel opening 2351, and the pixel opening 2351 of the partition wall 350 may overlap the anode 2191. The light-emitting element layer 2370 may be positioned within the pixel opening 2351 of the partition wall 350. The light-emitting element layer 2370 may overlap the anode 2191. The cathode 270 may be positioned above the light-emitting element layer 2370 and the partition wall 350. The anode 1191, the light-emitting element layer 1370, and the cathode 270 may constitute the second light-emitting element ED2. The cathode 270 positioned in the first display area DA1 and the second display area DA2 may be connected to each other and may be formed integrally.

As described above, in the display device according to an embodiment, the pixel positioned in the first display area DA1 and the pixel positioned in the second display area DA2 may be designed differently. The size of the pixel positioned in the first display area DA1 may be relatively smaller than the size of the pixel positioned in the second display area DA2. The size of the first pixel circuit unit PC1 may be relatively smaller than the size of the second pixel circuit unit PC2, and the size of the first light-emitting element ED1 may be relatively smaller than the size of the second light-emitting element ED2. The number of the pixels per unit area in the first display area DA1 may be greater than the number of the pixels per unit area in the second display area DA2. The number of the first pixel circuit units PC1 per unit area may be greater than the number of the second pixel circuit units PC2 per unit area. The number of the first light-emitting elements ED1 per unit area may be greater than the number of the second light-emitting elements ED2 per unit area. In addition, in the first display area DA1, no opening is formed in the first interlayer insulating layer 161 and the second interlayer insulating layer 162 is not positioned, and in the second display area DA2, the opening 21165 is formed in the first interlayer insulating layer 161 and the second interlayer insulating layer 162 may be positioned in the opening 21165. That is, in the first display area DA1, the adjacent pixels are connected to each other on the entire layer, and in the second display area DA2, the adjacent pixels are connected to each other in only some layers and are separated in some other layers. Comprehensively considering this, the first display area DA1 may implement a relatively high resolution, and the second display area DA2 may have a relatively low resolution but may have a structure that is advantageous for bending. In addition, a part of the second light-emitting element ED2 connected to the second pixel circuit unit PC2 of the pixel positioned in the second display area DA2 overlaps the driving circuit unit DR, so that an image may also be displayed in the region overlapping the driving circuit unit DR. Accordingly, the dead space of the display device may be reduced, and the bezel may be reduced.

Next, the display device according to an embodiment is described with reference to FIG. 22.

Figure 22:
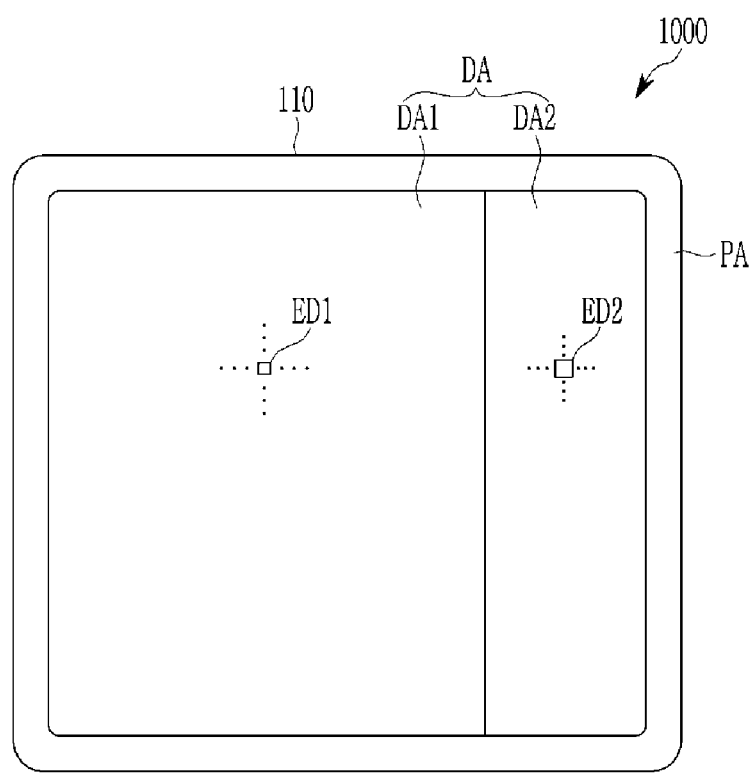
FIG. 22 is a top plan view showing a display device according to an embodiment.

The display device according to the embodiment shown in FIG. 22 is the same as most of the display device according to the embodiment shown in FIG. 1 to FIG. 21, so that a description of the same parts is omitted for sake of brevity. The present embodiment differs from the previous embodiment in that it does not include a bending region, and this is further described below.

FIG. 22 is a top plan view showing a display device according to an embodiment.

As shown in FIG. 22, a display device 1000 according to an embodiment includes a substrate 110, and light-emitting elements ED1 and ED2 disposed on the substrate 110.

The substrate 110 includes a display area DA and a peripheral area PA adjacent to the display area DA. The display area DA may include a first display area DA1 and a second display area DA2 adjacent to the first display area DA1. For example, the first display area DA1 may be positioned on the left, and the second display area DA2 may be positioned on the right. However, the present invention is not limited thereto, and the arrangement form of the first display area DA1 and the second display area DA2 may be variously changed. The peripheral area PA may be formed of a shape surrounding the display area DA.

The light-emitting element ED1 and ED2 may emit predetermined light. The light-emitting element ED1 and ED2 may include a first light-emitting element ED1 and a second light-emitting element ED2. The first light-emitting element ED1 may be positioned in the first display area DA1, and the second light-emitting element ED2 may be positioned in the second display area DA2. The first display area DA1 and the second display area DA2 have different resolutions. The resolution of the first display area DA1 may be relatively higher than the resolution of the second display area DA2. In this case, the pixel disposed in the first display area DA1 and the pixel disposed in the second display area DA2 may be differently designed.

In case of the pixel disposed in the first display area DA1, like the pixel shown in FIG. 5 to FIG. 11 as above-described, the opening may not be formed in the first interlayer insulating layer. In case of the pixel disposed in the second display area DA2, like the pixel shown in FIG. 12 to FIG. 21 as above-described, the opening may be formed in the first interlayer insulating layer and the second interlayer insulating layer may be positioned within the opening. That is, in the case of the second display area DA2 with the relatively lower resolution, by separating a plurality of pixel circuit regions, even if the impact is applied from the outside, it may be prevented from affecting other surrounding pixels.

In the previous embodiment, it is described that at least a part of the driving circuit unit overlaps the second display area DA2, however in the present embodiment, the driving circuit unit may be positioned in the peripheral area PA and may not be positioned in the display area DA. Also, in the previous embodiment, it is described that the light emission region of the second light-emitting element ED2 positioned in the second display area DA2 may not overlap the second pixel circuit unit connected thereto, however in the present embodiment, the light emission region of the second light-emitting element ED2 positioned in the second display area DA2 may overlap the second pixel circuit unit connected thereto.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a first display area and a second display area;
a plurality of first pixel circuit units positioned on the first display area;
a plurality of first light-emitting elements respectively connected to the plurality of first pixel circuit unit;
a plurality of second pixel circuit units positioned on the second display area;
a plurality of second light-emitting elements respectively connected to the plurality of second pixel circuit units; and
a driving circuit unit connected to the plurality of first pixel circuit units and the plurality of second pixel circuit units and overlapping the plurality of second light-emitting elements,
wherein a number of the plurality of first pixel circuit units per unit area is larger than a number of the plurality of second pixel circuit units per unit area.

2. The display device of claim 1, further comprising:
a first interlayer insulating layer positioned on the substrate and including an opening; and
a second interlayer insulating layer positioned within the opening,
and the opening is positioned in the second display area.

3. The display device of claim 2, wherein
the first interlayer insulating layer includes an inorganic insulating material, and
the second interlayer insulating layer includes an organic insulating material.

4. The display device of claim 3, wherein
the opening and the second interlayer insulating layer are not positioned in the first display area.

5. The display device of claim 3, wherein
the display device includes a plurality of pixel circuit regions,
the plurality of second pixel circuit units are respectively positioned in the plurality of pixel circuit regions, and
the plurality of pixel circuit regions are separated from each other by the opening and the second interlayer insulating layer in the second display area.

6. The display device of claim 5, wherein
the opening is formed to surround an edge of the plurality of pixel circuit regions, so that the plurality of pixel circuit regions are separated from each other by the opening.

7. The display device of claim 5, wherein
the opening has a lattice shape in a plan view.

8. The display device of claim 5, wherein
the second interlayer insulating layer has a lattice shape in a plan view.

9. The display device of claim 5, wherein
each of the plurality of second pixel circuit units includes:
a semiconductor positioned in the substrate;
a first gate insulating layer positioned on the semiconductor;
a gate electrode positioned on the first gate insulating layer;
a second gate insulating layer positioned on the gate electrode; and
a first storage electrode positioned on the second gate insulating layer,
wherein the first interlayer insulating layer is positioned on the first storage electrode, and
wherein the first storage electrodes of the plurality of second pixel circuit units are separated from each other by the opening and the second interlayer insulating layer.

10. The display device of claim 9, further comprising
a bridge electrode positioned on the first interlayer insulating layer and the second interlayer insulating layer and connecting two first storage electrodes adjacent to each other among the first storage electrodes of the plurality of second pixel circuit units.

11. The display device of claim 9, wherein
the opening is further formed in the first gate insulating layer and the second gate insulating layer.

12. The display device of claim 5, further comprising:
a plurality of lower scan lines connected to the plurality of second pixel circuit units and respectively positioned within the plurality of pixel circuit regions; and
an upper scan line connected to the plurality of lower scan lines,
wherein the plurality of lower scan lines are separated by the opening.

13. The display device of claim 12, wherein
the upper scan line overlaps the opening.

14. The display device of claim 1, wherein
the substrate further includes a bending region overlapping the second display area, and
the plurality of second pixel circuit units are positioned within the bending region.

15. The display device of claim 1, wherein
each light emission region of the plurality of first light-emitting elements overlaps the plurality of first pixel circuit units connected to the plurality of first light-emitting elements, and
the light emission region of at least any one of the plurality of second light-emitting elements does not overlap a corresponding second pixel circuit unit connected to the at least any one of the plurality of second light-emitting elements and overlaps another second pixel circuit unit that is not connected to the at least any one of the plurality of second light-emitting elements.

16. A display device comprising:
a substrate including a first display area and a second display area;
a first pixel circuit unit positioned on the first display area;
a second pixel circuit unit positioned on the second display area;
a first interlayer insulating layer positioned between a plurality of conductive layers configuring the first pixel circuit unit and the second pixel circuit unit and including an opening;
a second interlayer insulating layer positioned within the opening;
a first light-emitting element connected to the first pixel circuit unit;
a second light-emitting element connected to the second pixel circuit unit; and
a driving circuit unit connected to the first pixel circuit unit and the second pixel circuit unit and overlapping the second light-emitting element,
wherein the opening is positioned in the second display area.

17. The display device of claim 16, wherein
the first interlayer insulating layer includes an inorganic insulating material,
the second interlayer insulating layer includes an organic insulating material, and
the opening and the second interlayer insulating layer are not positioned in the first display area.

18. The display device of claim 17, wherein
the display device includes a plurality of pixel circuit regions,
a plurality of second pixel circuit units are positioned within each of the plurality of pixel circuit regions, and
the plurality of pixel circuit regions are separated from each other by the opening and the second interlayer insulating layer in the second display area.

19. The display device of claim 18, wherein
the substrate further includes a bending region overlapping the second display area, and
the plurality of second pixel circuit units are positioned within the bending region.

20. A display device comprising:
a substrate including a first display area and a second display area;
a first pixel circuit unit positioned on the first display area;
a second pixel circuit unit positioned on the second display area;
a first interlayer insulating layer positioned between a plurality of conductive layers configuring the first pixel circuit unit and the second pixel circuit unit and including an opening;
a second interlayer insulating layer positioned within the opening;
a first light-emitting element connected to the first pixel circuit unit; and
a second light-emitting element connected to the second pixel circuit unit,
wherein the substrate further includes a bending region overlapping the second display area, and
the second pixel circuit unit and the opening are positioned in the bending region.

* * * * *